(12) United States Patent
Mostoller et al.

(10) Patent No.: US 9,706,660 B1
(45) Date of Patent: Jul. 11, 2017

(54) SOLAR JUNCTION BOX

(71) Applicants: TYCO ELECTRONICS CORPORATION, Berwyn, PA (US); Tyco Electronics UK Ltd., Swindon, Wiltshire (GB)

(72) Inventors: Matthew Edward Mostoller, Hummelstown, PA (US); Subhash Mungarwadi, Swindon (GB)

(73) Assignees: TE Connectivity Corporation, Berwyn, PA (US); Tyco Electronics UK Ltd., Swindon (GB)

( * ) Notice: Subject to any disclaimer, the term of this patent is extended or adjusted under 35 U.S.C. 154(b) by 0 days.

(21) Appl. No.: 15/252,547

(22) Filed: Aug. 31, 2016

(51) Int. Cl.
*H05K 1/18* (2006.01)
*H05K 5/00* (2006.01)
*H02S 40/34* (2014.01)
*H01R 25/00* (2006.01)
*H05K 5/02* (2006.01)
*H01R 4/48* (2006.01)

(52) U.S. Cl.
CPC .................. *H05K 1/18* (2013.01); *H01R 4/48* (2013.01); *H01R 25/003* (2013.01); *H02S 40/34* (2014.12); *H05K 5/0026* (2013.01); *H05K 5/0069* (2013.01); *H05K 5/0217* (2013.01); *H05K 5/0247* (2013.01)

(58) Field of Classification Search
CPC ........... H01R 4/48; H05K 1/18; H05K 5/0026
See application file for complete search history.

(56) References Cited

U.S. PATENT DOCUMENTS

2015/0255889 A1\* 9/2015 Chang .................... H05K 3/325
361/783
2016/0359449 A1\* 12/2016 Gingrich, III ........ H01L 31/049

\* cited by examiner

*Primary Examiner* — Jeremy C Norris

(57) ABSTRACT

A solar junction box includes a housing having a base and walls defining a cavity. The base has an opening configured to receive a conductive foil. A power cable is held in the housing having a power terminal terminated to an end of the power cable positioned within the housing. An electronic module is removably received in the cavity. The electronic module has a circuit board including electronic components mounted to the circuit board, a foil contact configured to be removably coupled to the foil, and a power contact configured to be removably coupled to the power terminal. The circuit board has a power circuit electrically connecting the foil contact and the power contact.

20 Claims, 13 Drawing Sheets

SOLAR JUNCTION BOX

BACKGROUND OF THE INVENTION

The subject matter herein relates generally to solar junction boxes for solar panels.

Photovoltaic (PV) modules or arrays, such as solar panels, produce electricity from solar energy. Electrical power produced by PV modules reduces the amount of energy required from non-renewable resources such as fossil fuels and nuclear energy. Significant environmental benefits are also realized from solar energy production, for example, reduction in air pollution from burning fossil fuels, reduction in water and land use from power generation plants, and reduction in the storage of waste byproducts. Solar energy produces no noise, and has few moving components. Because of their reliability, PV modules also reduce the cost of residential and commercial power to consumers.

PV cells are essentially large-area semiconductor diodes. Due to the photovoltaic effect, the energy of photons is converted into electrical power within a PV cell when the PV cell is irradiated by a light source such as sunlight. PV cells are typically interconnected into solar modules that have power ranges of up to 100 watts or greater. For large PV systems, special PV modules are produced with typical power range of up to several 100 W. A photovoltaic module is the basic element of a photovoltaic power generation system. A PV module has many solar cells interconnected in series or parallel, according to the desired voltage and current parameters. PV cells are connected in series with thin contacts, such as a foil. The foil is terminated to a solar junction box, which may electrically connect groups of the PV cells and/or solar panels.

The solar junction box is typically connected to the back side of the solar panel, such as to a back sheet. The foil is terminated to a corresponding terminal in the junction box. In typical PV modules, many solar panels are connected in series using electrical cables routed between corresponding junction boxes of such solar panels. Additionally, some of the junction boxes are electrically connected to other equipment, such as batteries or power converters, and take the collected solar energy to such other equipment. The electrical cables are typically terminated to the terminals in the junction boxes with a permanent connection. For example, the electrical cables may be soldered to the terminals. Such connections are typically made in the manufacturing factory rather than in the field. Other systems use connectors provided at ends of the cables to interconnect the junction boxes.

As PV systems become more advanced, it is becoming desirable to provide additional functionality within the PV system. For instance, there is a need to integrate electronics into the PV system. For example, it is desirable to introduce diodes to control the flow of electricity in the solar panels. Some junction boxes contain integrated circuit boards, which are directly attached to the junction box and are soldered to the terminals and/or wires. Such circuit boards are not removable and replaceable in the field.

A need remains for field installable circuit boards to solar junction boxes.

BRIEF DESCRIPTION OF THE INVENTION

In one embodiment, a solar junction box is provided for a solar panel having at least one photovoltaic cell and a conductive foil electrically connected to the at least one cell. The solar junction box includes a housing having a base and walls defining a cavity. The base has an opening configured to receive the conductive foil. A power cable is held in the housing having a power terminal terminated to an end of the power cable positioned within the housing. An electronic module is removably received in the cavity. The electronic module has a circuit board including electronic components mounted to the circuit board, a foil contact configured to be removably coupled to the foil, and a power contact configured to be removably coupled to the power terminal. The circuit board has a power circuit electrically connecting the foil contact and the power contact.

In another embodiment, a solar junction box is provided for a solar panel having at least one photovoltaic cell and a conductive foil electrically connected to the at least one cell. The solar junction box includes a housing having a base and walls defining a cavity. The base has an opening configured to receive the conductive foil. A power cable is held in the housing having a power terminal terminated to an end of the power cable positioned within the housing. An electronic module is removably received in the cavity. The electronic module has a circuit board including electronic components mounted to the circuit board. The electronic module has a potting layer bonded to the circuit board and encapsulating the electronic components. The electronic module has a foil contact configured to be removably coupled to the foil and a power contact configured to be removably coupled to the power terminal. The circuit board has a power circuit electrically connecting the foil contact and the power contact.

In a further embodiment, a solar junction box is provided for a solar panel having at least one photovoltaic cell and a conductive foil electrically connected to the at least one cell. The solar junction box includes a housing having a base and walls defining a cavity. The base has an opening configured to receive the conductive foil. A power cable is held in the housing having a power terminal terminated to an end of the power cable positioned within the housing. An electronic module is removably received in the cavity. The electronic module has a circuit board, a foil contact mounted to the circuit board and configured to be removably coupled to the foil, and a power contact mounted to the circuit board and configured to be removably coupled to the power terminal. The circuit board has a power circuit electrically connecting the foil contact and the power contact. The electronic module has a monitoring circuit monitoring power through the power circuit and generating an output. The electronic module has a communication circuit communicating the output form the monitoring circuit outside of the solar junction box.

DETAILED DESCRIPTION OF THE INVENTION

Figure 1:
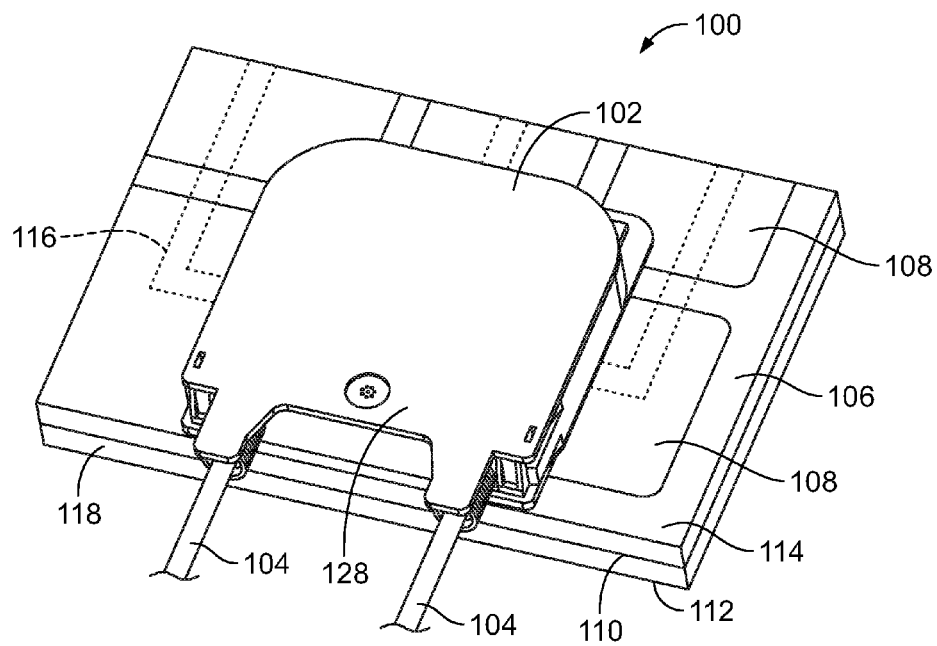
FIG. 1 illustrates a photovoltaic (PV) system including a solar junction box formed in accordance with an exemplary embodiment.

FIG. 1 illustrates a photovoltaic (PV) system 100 formed in accordance with an exemplary embodiment. The PV system 100 includes one or more solar junction boxes 102 (one shown in FIG. 1), which may be electrically connected by power cables 104. The PV system 100 includes a plurality of PV components 106. In an exemplary embodiment, the PV components 106 may be any type of PV components, such as PV modules or arrays that are used to generate electricity, such as solar panels, or other PV components used within the PV system 100 such as power storage devices, sensors, controllers, and the like. In the illustrated embodiment, the PV component 106 is a solar panel and may be referred to hereinafter as solar panel 106. The solar panel 106 has a plurality of PV cells 108 configured to generate electricity.

The cables 104 may be coupled to solar junction boxes 102 of the same solar panel 106 or solar junction boxes 102 of different solar panels 106. The cables 106 may couple the solar junction boxes 102 to other components within the PV system 100. The cables 104 transmit power and/or data along the transmission path between the junction boxes 102 and/or PV components 106.

In an exemplary embodiment, the solar panel 106 includes a semiconductor layer 110 sandwiched between a front sheet 112 and a back sheet 114. The front and back sheets 112, 114 may be glass sheets or may be manufactured from other materials. The semiconductor layer 110 includes the cells 108 and conductors, such as conductive foils 116, connecting the cells 108 in series. Groups of the cells 108 may be electrically connected to the corresponding solar junction box 102. For example, the foil 116 may be terminated to a corresponding terminal in the solar junction box 102. Optionally, the solar junction box 102 may be mounted to the solar panel 106 at or near an edge 118 of the solar panel 106. Alternatively, the solar junction box 102 may be mounted to the solar panel 106 remote from the edge 118, such as near a center of the solar panel 106 and the foil 116 may pass through a slot in the back sheet 114.

The front sheet 112 is positioned above the semiconductor layer 110 and allows sunlight to pass therethrough to the cells 108. The back sheet 114 is positioned below the semiconductor layer 110. The back sheet 114 may be a plastic layer. Alternatively, the back sheet 114 may be manufactured from another material. For example, the back sheet 114 may be another glass layer. For example, in some various embodiments, the solar panel 106 may be a bifocal solar panel configured to receive sunlight from both sides of the solar panel 106. For example, the backside (back sheet 114) may receive reflective sunlight. The foils 116 from the semiconductor layer 110 exit the solar panel 106 for termination to terminals in the solar junction box 102. The foil 116 may be routed in any direction along the solar panel 106, such as up the panel, down the panel, side-to-side across the panel, transverse across the panel, longitudinally, laterally, or otherwise. The foil 116 may be parallel to one of the edges 118; however the foil 116 may be transverse to the edges 118 in alternative embodiments. Additionally, different foils 116 may be routed in different directions.

While FIG. 1 is a bottom perspective view showing the solar junction box 102 mounted to the back sheet 114, in use, the front sheet 112 would be on top or upward facing to face the sun and the solar junction box 102 would be mounted to the backside of the solar panel 106. Other orientations are possible and terms denoting orientation (e.g., top, bottom, up, down, etc.) may be relative to the orientation shown in the particular Figure as opposed to an orientation in use.

The solar junction box 102 includes a lid or cover 128 coupled to a housing 130, which is configured to be mounted to the solar panel 106. The housing 130 holds terminals or contacts for interfacing with the conductive foil 116 and the cables 104. The housing 130 holds an electronic module 150 (shown in FIG. 3) having components for operating the solar junction box 102. For example, the electronic module may include a monitoring circuit, a shut-down circuit, a bypass circuit, a communication circuit and/or other types of circuits for controlling operation of the solar junction box 102 and/or the PV system 100. The electronic module may be removable and replaceable such as to change operation of the solar junction box 102 or to repair or replace portions of the PV system 100. Removal of the cover 128 provides access to the electronic module in the housing 130.

Figure 2:
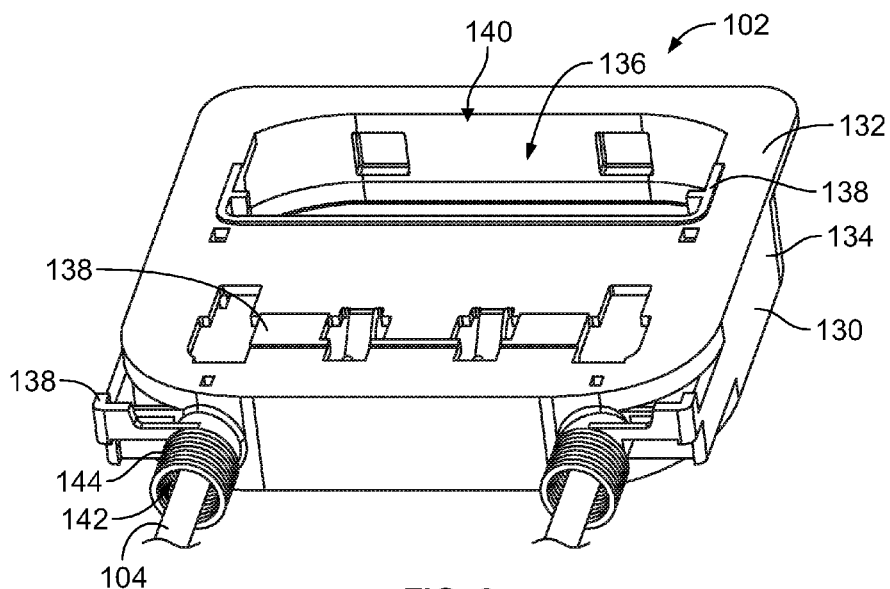
FIG. 2 is a perspective view of a housing of a solar junction box.

FIG. 2 is a perspective view of the housing 130 of the solar junction box 102. The housing 130 includes a base 132 and a plurality of walls 134 extending from the base 132. The walls 134 define a cavity 136 configured to receive the terminals, contacts, electronic module, conductive foil, power cables, and the like. Any number of walls 134 may be provided to provide an appropriate shaped cavity 136 for the particular application. Optionally, the housing 130 may have a rectangular cross. Other shapes are possible in alternative embodiments.

In an exemplary embodiment, the housing 130 includes standoffs 138 extending from the base 132. The standoffs 138 are used to position the base 132 above the back sheet 114 (shown in FIG. 1). The standoffs 138 may provide a space between the base 132 and the back sheet 114, such as for routing the foils 116 into the housing 130. The standoffs 138 provide a space for adhesive or sealant to be placed to attach the housing 130 to the back sheet 114. The standoffs 138 may be used to provide an air space between the base 132 and the back sheet 114, such as to reduce thermal transfer or radiation into the solar junction box 102 from the solar panel 106 (for example, smaller surface area of contact therebetween).

The housing 130 includes an opening 140 in the base 132. The opening 140 provides access to the cavity 136. The conductive foils 116 may pass through the opening 140 into the cavity 136, such as for termination to corresponding contacts.

The housing 130 includes cable channels 142 in one or more of the walls 134 that receive corresponding power cables 106. The cable channels 142 may be cylindrical. The cable channels 142 may be formed in a sleeve 144 extending from the wall 134. The sleeve 144 may be threaded to receive a threaded connector. The cable channel 142 may be sealed, such as for environmental sealing of the solar junction box 102.

Figure 3:
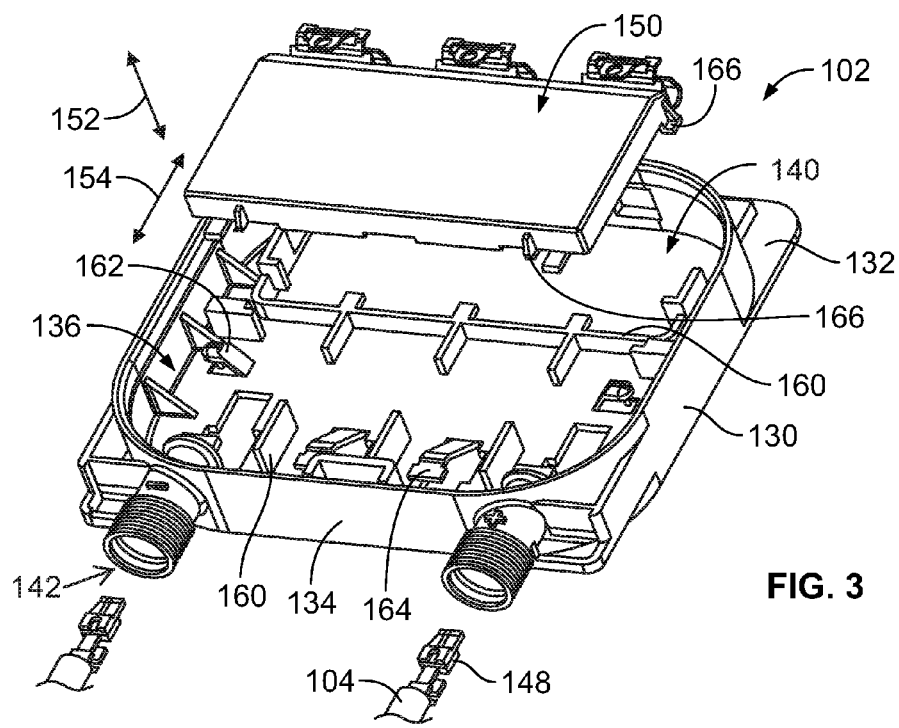
FIG. 3 is a perspective view of a solar junction box illustrating an electronic module poised for loading into the housing.
Figure 4:
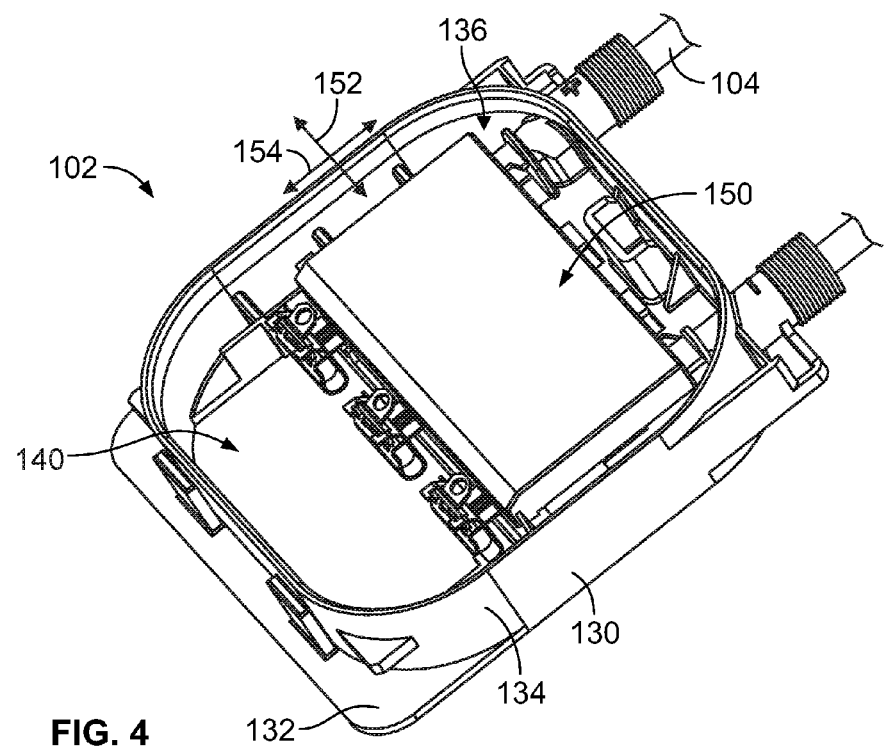
FIG. 4 is a perspective view of a solar junction box showing an electronic module.

FIG. 3 is a perspective view of the solar junction box 102 with the cover 128 removed to illustrate an electronic module 150 poised for loading into the housing 130. FIG. 4 is a perspective view of the solar junction box 102 showing the electronic module 150 in the housing 130. FIG. 3 illustrates the power cables 104 poised for loading into the housing 130 and FIG. 4 illustrates the power cables 104 assembled in the housing 130. The power cables 104 include power terminals 148 terminated to ends of the power cables 104. The power terminals 148 and ends of the power cables 104 are configured to be loaded into corresponding cable channels 142. The power terminals 148 may be held in the housing 130 for electrical connection to the electronic module 150.

The electronic module 150 is loaded into the cavity 136 of the housing 130 through the open end of the housing 130 (for example, the end receiving the cover 128). For example, the electronic module 150 may be loaded into the housing 130 in a first direction such as along a loading axis 152 generally parallel to the walls 134 of the housing 130. Optionally, once the electronic module 150 is loaded into the cavity 136, the electronic module 150 may be slid in a second direction such as along a mating axis 154 for mating with the power terminals 148. In an exemplar embodiment, the mating direction is perpendicular to the loading direction. The mating axis 154 may be generally parallel to the base 132 of the housing 130. The electronic module 150 may be easily mated to and unmated from the power terminals 148, such as to remove and/or replace the electronic module 150 in the housing 130.

The housing 130 includes alignment features 160 used to locate the electronic module 150 in the cavity 136. The alignment features 160 may be ribs, blocks, tabs, or other features used for positioning the electronic module 150 in the cavity 136. The electronic module 150 may engage the alignment features 160, such as to hold vertical and/or horizontal positions of the electronic module 150. For example, the alignment features 160 may define up-and-down, side-to-side and/or front-to-back positions of the electronic module 150.

Optionally, the housing 130 may include one or more deflectable locating features 162 engaging the electronic module 150 for positioning the electronic module 150 in the cavity 136. The locating features 162 may be deflected when engaging the electronic module 150. The deflectable locating features 162 may bias the electronic module 150 in one or more directions within the cavity 136. For example, the locating features 162 may bias the electronic module 150 away from the base 132, and thus away from the heat generating solar panel 106. The locating features 162 may bias the electronic module 150 against a heatsink or other thermal transfer element, such as the cover 128. In the illustrated embodiment, the locating features 162 are integral with the housing 130. For example, the locating features 162 may be molded with the housing 130. In alternative embodiments, separate locating features 162 may be provided. For example, separate biasing members may be held by the housing 130 and define the locating features 162. For example, coil springs may be held by the housing 130 and engage the electronic module 150 to locate the electronic module 150 in the cavity 136.

The housing 130 includes one or more securing features 164 for securing the electronic module 150 in the cavity 136. The securing features 164 may be latches, clips, fasteners or other types of securing features 164. In the illustrated embodiment, the securing features 164 are represented by deflectable latches. In an exemplar embodiment, the securing features 164 are releasable to allow the electronic module 150 to be removed from the cavity 136. For example, in the illustrated embodiment, the deflectable latches may be unlatched from the electronic module 150 to allow removal of the electronic module 150. In the illustrated embodiment, the securing features 164 restrict movement along the mating axis 154 in an unmating direction. Other securing features 164 may be provided to restrict movement in other directions, such as along the loading axis 152, such as in an unloading direction. In an exemplary embodiment, such as in the illustrated embodiment, non-deflectable or fixed securing features 164 may also be provided to secure the electronic module 150 in the cavity 136. For example, the fixed securing features 164 may be blocks or surfaces that engage portions of the electronic module 150 to secure the electronic module 150 in a loaded and mated position.

Optionally, the electronic module 150 may be slid from a secured position to an unsecured position relative to the fixed securing features 164 to allow removal of the electronic module 150 from the cavity 136. For example, in the illustrated embodiment, the electronic module 150 includes guide rails 166 that guide mating and unmating of the electronic module 150. The guide rails 166 engage corresponding securing features 164 to secure the electronic module 150 in the cavity 136. For example, once the electronic module 150 is loaded into the cavity 136, the electronic module 150 may be slid along the mating axis 154 in a mating direction. As the electronic module 150 is slid in the mating direction, the guide rails 166 engage corresponding features 164. The guide rails 166 and securing features 164 may resist liftoff or inadvertent removal of the electronic module 150.

The electronic module 150 may be released by sliding the electronic module 150 along the mating axis 154 in an unmating direction until the guide rails 166 clear the securing features 164 to allow removal of the electronic module 150 from the housing 130. Optionally, the guide rails 166 may fix the position of the electronic module 150 in the cavity 136 in at least two perpendicular directions (for example, side-to-side, up-and-down, and/or front-to-back).

Figure 5:
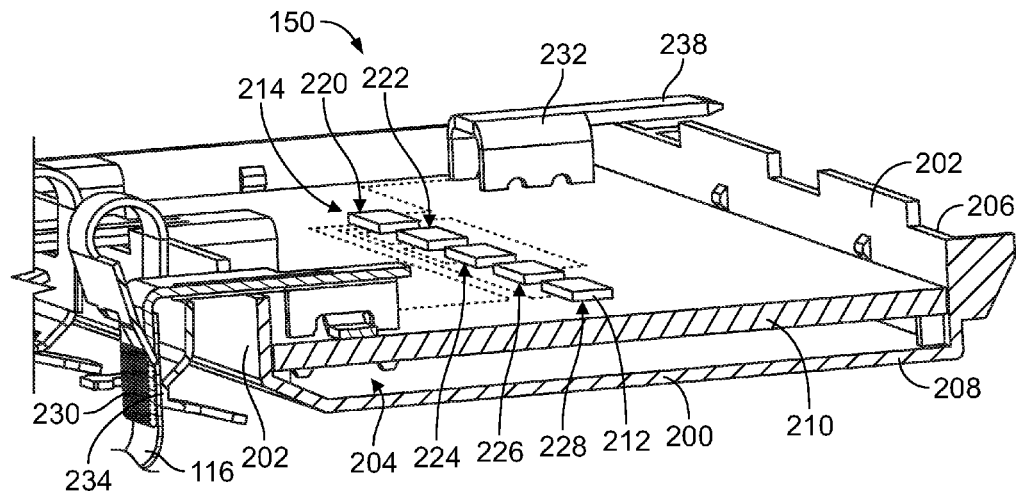
FIG. 5 is a sectional view of a portion of an electronic module in accordance with an exemplary embodiment.

FIG. 5 is a sectional view of a portion of the electronic module 150 in accordance with an exemplary embodiment. The electronic module 150 includes a tray 200 having tray walls 202 defining a tray cavity 204. The tray 200 may include an open end 206 and a closed end 208. The tray 200 may be manufactured from a dielectric material, such as a plastic material and is used to hold various components of the electronic module 150. Optionally, the tray 200 is configured to be filled with potting material to provide an environmental seal for the components of the electronic module 150.

The electronic module 150 includes a circuit board 210 including electronic components 212 (represented schematically in FIG. 5). Any type of electrical components 212 may be provided within the electronic module 150 for controlling operation of the solar junction box 102 and/or the PV system 100. The electronic components 212 illustrated in FIG. 5 represent various circuits 214 used for controlling operation of the solar junction box 102 and/or the PV system 100. Each circuit 214 may include any number and/or type of electronic components 212. For example, the electronic components 212 may include resistors, capacitors, diodes, transistors, conductors, integrated circuits, processors, sensors, conductive traces, and the like to define and control operation of the circuits 214.

In the illustrated embodiment, the electronic nodule 150 includes a power circuit 220, a monitoring circuit 222, a communication circuit 224, a shutdown circuit 226, and a bypass circuit 228. The electronic module 150 may include other circuits in alternative embodiments for controlling other functions of the solar junction box 102. In other various embodiments, the electronic module 150 may eliminate one or more of these circuits 220-228. In an exemplary embodiment, the circuit board 210 includes various conductive traces electrically connected to corresponding electronic components 212 to form and operate the circuits 214.

The electronic module 150 includes foil contacts 230 terminated to the circuit board 210 and power contacts 232 terminated to the circuit board 210. The foil contacts 230 are configured to be electrically connected to corresponding conductive foils 116 (shown in FIG. 1) of the solar panel 106. The power contacts 232 are configured to be electrically connected to corresponding power terminals 148 (shown in FIG. 2) of corresponding power cables 104. In an exemplary embodiment, the foil contacts 230 are configured to be removably coupled to the conductive foils 116 to allow removal of the electronic module 150. In an exemplary embodiment, the power contacts 232 are configured to be removably coupled to the power terminals 148 to allow removal of the electronic module 150.

In the illustrated embodiment, the contacts 230, 232 are press-fit mounted to the circuit board 210. Alternatively, the contacts 230, 232 may be soldered to the circuit board 210. The contacts 230, 232 may be terminated to the circuit board 210 by other means in alternative embodiments.

In an exemplary embodiment, the foil contacts 230 have separable mating interfaces 234 that are separably terminated to corresponding conductive foils 116. In the illustrated embodiment, the foil contacts 230 include foil clips used to removably couple to the conductive foil 116; however, other types of foil contacts 230 may be provided in alternative embodiments. In an exemplary embodiment, the power contacts 232 include separable mating interfaces 236 configured to be separably coupled to the power terminals 148. In the illustrated embodiment, the power contacts 232 include blades or tabs 238 defining the separable mating interfaces 236. Each tab 238 is configured to be pluggably connected to the power terminal 148. However, in alternative embodiments, other types of contacts may be provided, such as a socket contact, a spring beam, and the like.

In an exemplary embodiment, one or more of the circuits 214 are configured to be electrically connected to the foil contacts 230 and/or the power contacts 232. Optionally, one or more of the circuits 214 may be electrically connected to another of the circuits 214.

In an exemplary embodiment, the power circuit 220 is electrically connected to one or more of the foil contacts 230 and/or one or more of the power contacts 232. For example, the power circuit 220 may include one or more conductors, such as conductive traces of the circuit board 210, to electrically connect the foil contacts 230 with the power contacts 232. As such, the power generated by the solar panel 106 may be transmitted from the foil contacts 230 to the power contacts 232, and thus the power cables 104, through the power circuit 220.

Optionally, the monitoring circuit 222 may monitor one or more characteristics of the power circuit 220 or of other components of the PV system 100. For example, the monitoring circuit 222 may include one or more sensors for monitoring current, voltage, or other characteristics of the power circuit 220. The monitoring circuit 222 may include one or more integrated circuits, processors, or other hardware components for analyzing data generated by the sensors, one or more memory components for storing data from the sensors or the analyzing components, and the like. Optionally, the monitoring circuit 222 may generate an output. The output may be an electrical signal. The output may relate to the current or voltage passing through the solar junction box 102, such as to monitor one or more of the solar panels 106 and/or one or more of the PV cells 108. The output may be used to schedule maintenance of the solar panel 106 and/or the solar junction box 102.

The communication circuit 224 may be operably connected to the monitoring circuit 222 and/or the power circuit 220. The communication circuit 224 may include communication components, such as an antenna for communicating outside of the solar junction box 102. For example, the communication circuit 224 may communicate wirelessly. The communication circuit 224 may send and/or receive information. For example, the communication circuit 224 may transmit the output outside of the solar junction box 102, such as to a central control of the PV system 100. Optionally, the communication circuit 224 may receive data, such as from other solar junction boxes and/or from the central control of the PV system 100 to control operation of the solar junction box 102. For example, the communication circuit 224 may receive a shutdown signal for shutting down, or opening, the power circuit 220, such that current is unable to flow between the foil contact 230 and the power contact 232.

The shutdown circuit 226 may be operable coupled to one or more other circuits, such as the communication circuit 224, the power circuit 220, or others. The shutdown circuit 226 includes one or more components used to shut down the power circuit 220. For example, the shutdown circuit 226 may include a switch or relay that may be opened to open the power circuit 220 and shut down operation of the solar junction box 102 and or the PV system 100. For example, during repair or replacement of the solar panel 106 the power circuit 220 may be shut down to avoid risk of electric shock to the maintenance worker. In other various embodiments, the power circuit 220 may be shut down to reduce the risk of damage to the solar panel 106, such as, in the situation of a fire, inclement weather, shade of the solar panel 106, and the like.

The bypass circuit 228 may be operably connected to the power circuit 220 to bypass current flow through the solar junction box 102. For example, when the solar panel 106 associated with the solar junction box 102 is shaded the bypass circuit 228 may bypass the current to a different solar panel in the array that is not shaded. As such, current does not flow backwards through the system, such as through the cells 108 of the shaded solar panel 106, which could cause heating and/or damage to the system. The bypass circuit 228 includes bypass components, such as a bypass diode which allows current to bypass the solar junction box 102. For example, the current may flow from one power contact 232 to another of the power contacts 232, bypassing the foil contact 230.

Other types of circuits 214 may be provided in alternative embodiments to provide other functionality to the solar junction box 102.

Figure 6:
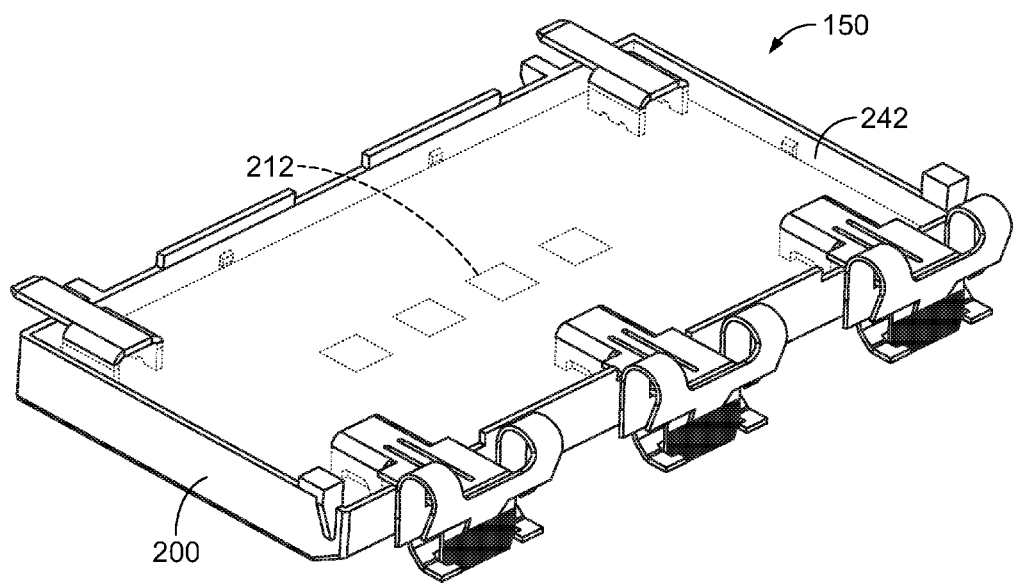
FIG. 6 illustrates an electronic module in accordance with an exemplary embodiment.

FIG. 6 illustrates the electronic module 150 showing a potting layer 242 bonded to the circuit board 210 and encapsulating the electronic components 212. The potting layer 242 is formed from potting material received in the tray 200. The potting material may be cured or hardened in the tray 200 to protect the electronic components 212. Optionally, the potting material may be thermo-setting plastics, silicone rubber gels, or other types of potting material. The potting layer 242 may resist shock or vibration of the electronic components 212 within the tray 200. The potting layer 242 may be used to provide environmental protection, such as from moisture or other contaminants. The potting layer 242 may be conformal around the circuit board 210 (FIG. 5), the electronic components 212 and the tray walls 202.

Figure 7:
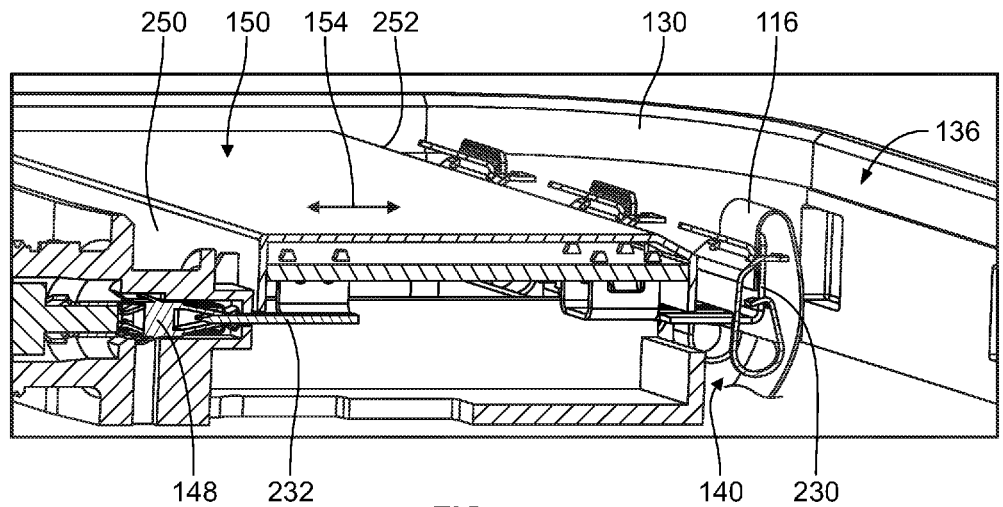
FIG. 7 is a sectional view of a portion of a solar junction box showing an electronic module in accordance with an exemplary embodiment.

FIG. 7 is a sectional view of a portion of the solar junction box 102 showing the electronic module 150 mounted in the cavity 136 of the housing 130. The power contact 232 is shown extending from a front end 250 of the electronic module 150 mated with the power terminal 148. In the illustrated embodiment, the power terminal 148 is a socket terminal and the power contact 232 is a tab contact configured to be separably mated with the power terminal 148. The power contact 232 is mated with the power terminal 148 by sliding the electronic module 150 along the mating axis 154 in the mating direction. The electronic module 150 may be unmated from the power terminal 148 by sliding the electronic module 150 away from the power terminal 148 along the mating axis 154 in an unmating direction.

When the electronic module 150 is loaded in the cavity 136, the foil contacts 230 extend from a back end 252 of the electronic module 150 and are aligned with the foil opening 140 in the housing 130. The conductive foils 116 may pass through the foil opening 140 and be terminated to the foil contacts 230. The electronic module 150 is thus used to electrically connect the conductive foils 116 with the power terminals 148. However, the circuits 214 may control the current flow between the conductive foils 116 and the power terminal 148.

Figure 8:
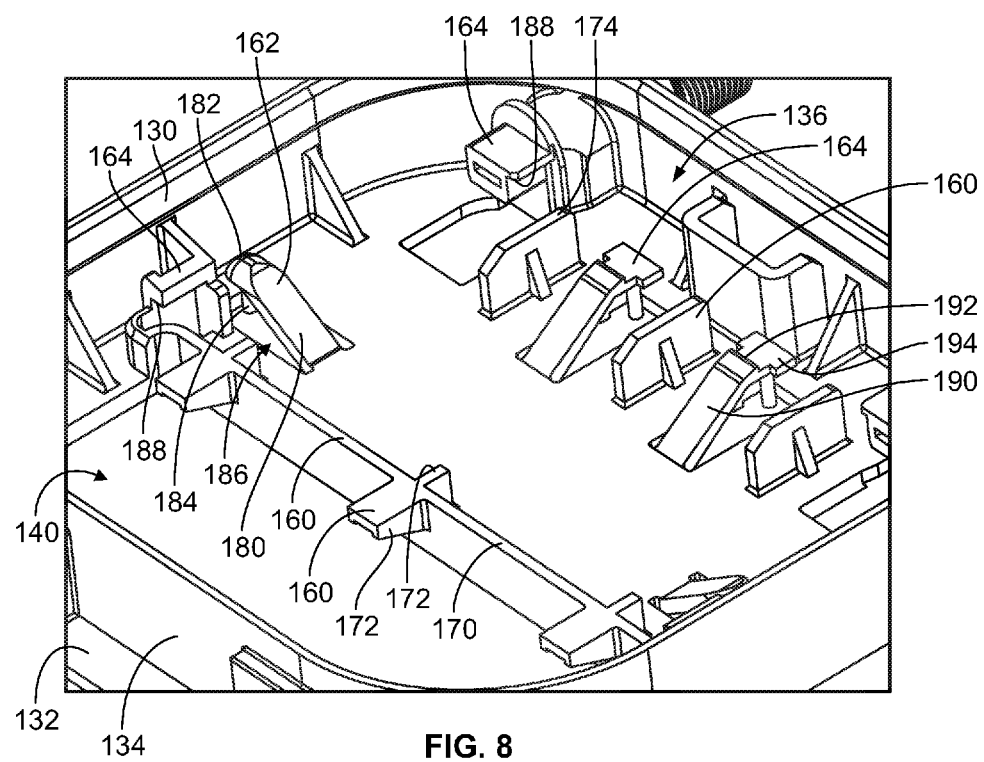
FIG. 8 illustrates a portion of a housing of a solar junction box.

FIG. 8 illustrates a portion of the housing 130 showing the alignment features 160, deflectable locating features 162 and the securing features 164 in accordance with an exemplary embodiment. In the illustrated embodiment, the alignment features 160 include a rib 170, tabs 172, and support blocks 174. Other types of alignment features 160 may be used in alternative embodiments. The rib 170 extends along the foil opening 140 and is used to support the back end 252 (shown in FIG. 7) of the electronic module 150. The rib 170 ties in to the walls 134 of the housing 130. The rib 170 extends from the base 132.

A plurality of the support blocks 174 extends from the rib 170 and/or the base 132. The support blocks 174 may be used to support the back end 252 of the electronic module 150. The tabs 172 are freestanding and extend from the base 132; however, the tabs 172 may extend from the walls 134 in alternative embodiments. The tabs 172 are used to support the front end 250 of the electronic module 150.

The deflectable locating features 162, in the illustrated embodiment, are provided along both sides of the housing 130. The locating features 162 each include a spring beam 180 extending to a supporting end 182. The supporting end 182 is used to support the electronic module 150. For example, the spring beams 180 may be used to support the electronic module 150 at or near the back end 252; however, the spring beams 180 may be in other locations in alternative embodiments. The spring beam 180 may be used to bias the electronic module 150 away from the base 132. In an exemplary embodiment, the locating feature 162 includes an overstress post 184 extending from the spring beam 180 such as at or near the supporting end 182. The overstress post 184 is used to limit travel or deflection of the locating feature 162, such as to avoid plastic deformation of the spring beam 180. Optionally, the spring beam 180 may be aligned with an opening 186 in the base 132. The overstress post 184 may extend into the opening 186 and may engage the solar panel 106 to stop travel of the spring beam 180.

In an exemplary embodiment, the housing 130 includes both deflectable securing features 164 and non-deflectable securing features 164. The non-deflectable securing features 164 include shoulders or ledges 188 configured to be engaged by the electronic module 150, such as the guide rails 166 (shown in FIG. 2) of the electronic module 150. The guide rails 166 may be captured under the ledges 188 when the electronic module 150 is secured in the cavity 136.

The deflectable securing features 164 include latches 190 configured to be releasably secured to the electronic module 150. The latches 190 include latching surfaces 192 configured to secure the electronic module 150 in the cavity 136. The latches 190 include release members 194 that are configured to be accessed to release the latches 190 from the electronic module 150. Optionally, the latches 190 may include overstress posts 184 extending therefrom. The overstress posts 184 limit over travel and plastic deformation of the latches 190. In an exemplary embodiment, the latches 190 are configured to be secured to the front end 250 of the electronic module 150. The latches 190 may be spring-biased against the electronic module 150 to bias the electronic module 150 away from the base 132.

Figure 9:
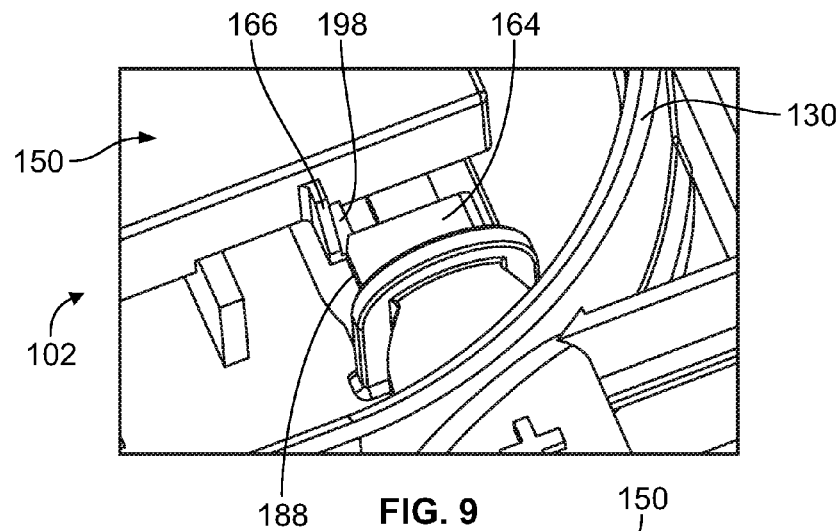
FIG. 9 illustrates a portion of a solar junction box showing an electronic module during assembly.

FIG. 9 illustrates a portion of the solar junction box 102 showing the electronic module 150 during assembly to the housing 130. FIG. 9 illustrates one of the guide rails 166 being secured to the corresponding securing feature 164. For example, the guide rail 166 includes a tab 198 configured to be captured by the ledge 188 of the securing feature 164. As the electronic module 150 is slid forward during mating, the tab 198 engages the ledge 188.

Figure 10:
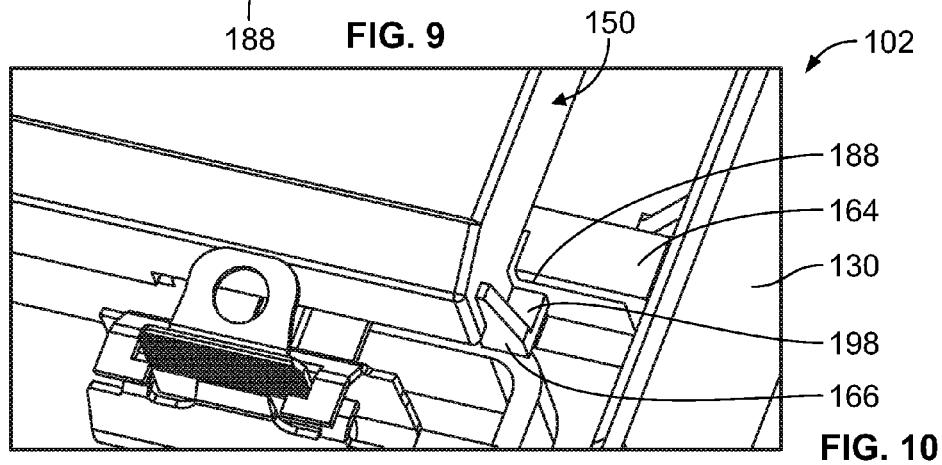
FIG. 10 illustrates a portion of a solar junction box showing an electronic module during assembly.

FIG. 10 illustrates a portion of the solar junction box 102 showing the electronic module 150 during assembly to the housing 130. FIG. 10 illustrates one of the guide rails 166 being secured to the corresponding securing feature 164. For example, the tab 198 of the guide rail 166 is configured to be captured by the ledge 188 of the securing feature 164. As the electronic module 150 is slid forward during mating, the tab 198 engages the ledge 188.

Figure 11:
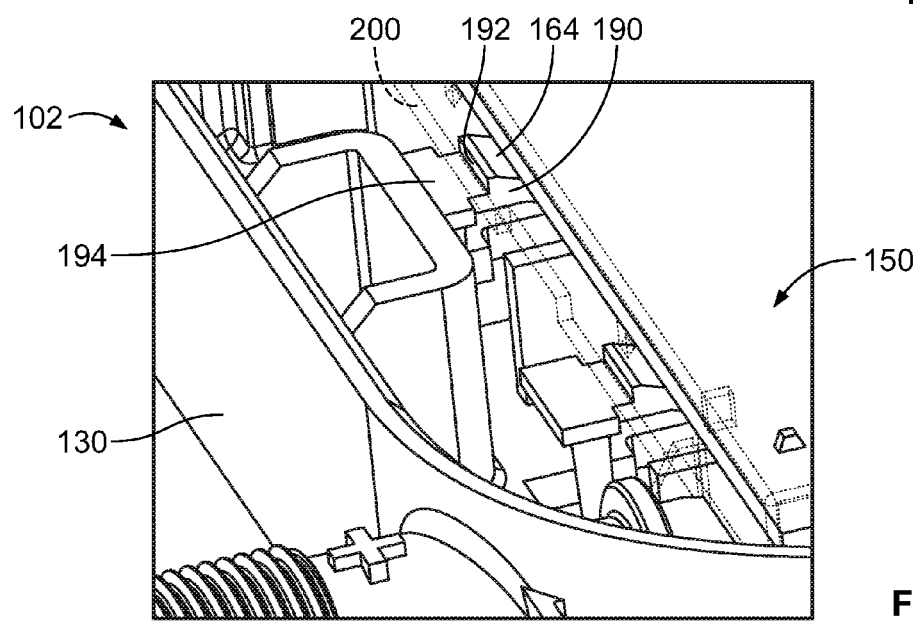
FIG. 11 illustrates a portion of a solar junction box in accordance with an exemplary embodiment.

FIG. 11 illustrates a portion of the solar junction box 102 showing the securing features 164 secured to the electronic module 150 (shown in phantom to illustrate the deflectable securing features 164). The latching surfaces 192 of the latches 190 are configured to engage the tray 200 of the electronic module 150. The latches 190 lock rearward movement of the tray 200 to secure the electronic module 150 in the housing 130. These latches 190 are releasable by pressing the release members 194. When the latches 190 are released, the electronic module 150 may be unmated and removed from the housing 130.

Figure 12:
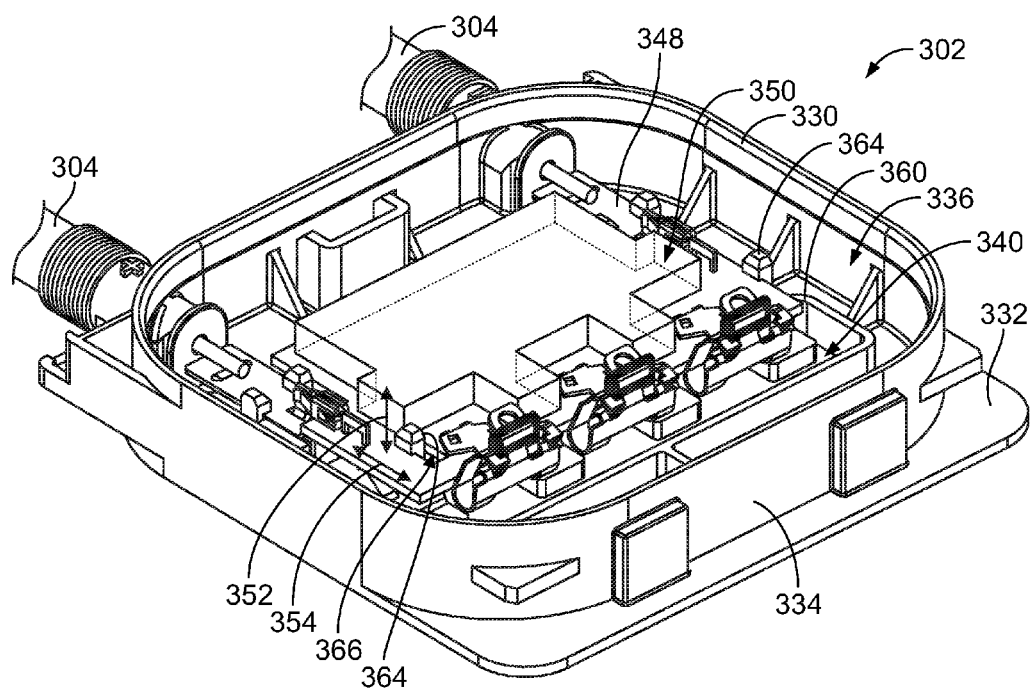
FIG. 12 is a perspective view of a solar junction box in accordance with an exemplary embodiment.

FIG. 12 is a perspective view of a solar junction box 302 in accordance with an exemplary embodiment. The solar junction box 302 is similar to the solar junction box 102 (FIG. 1) and may be used in the PV system 100 (FIG. 1). The solar junction box 302 includes the power cables 304, which extend into a housing 330 for termination to power terminals 348 held in the housing 330. The housing 330 includes a base 332 and a plurality of walls 334 extending from the base 332. The walls 334 define a cavity 336. In the illustrated embodiment, the power terminals 348 are located within the cavity 336. The housing 330 includes an opening 340 in the base 332 that receive the conductive foils 116. A cover (not shown) may be used to cover the cavity 336.

An electronic module 350 is configured to be removably received within the cavity 336 and electrically connected to the power terminals 348 and the conductive foils 116. The electronic module 350 is loaded into the cavity 336 of the housing 330 through the open end of the housing 330. For example, the electronic module 350 may be loaded into the housing 330 in a first direction along a loading axis 352 and then slid in a second direction along a mating axis 354 for mating with the power terminals 348. The electronic module 350 may be easily mated to and unmated from the power terminals 348, such as to remove and/or replace the electronic module 350 in the housing 330.

The housing 330 includes alignment features 360 used to locate the electronic module 350 in the cavity 336. The alignment features 360 may be ribs, blocks, tabs, deflectable beams, and the like used for positioning the electronic module 350 in the cavity 336. The electronic module 350 may engage the alignment features 360, such as to hold vertical and/or horizontal positions of the electronic module 350. For example, the alignment features 360 may define up-and-down, side-to-side and/or front-to-back positions of the electronic module 350.

The housing 330 includes one or more securing features 364 for securing the electronic module 350 in the cavity 336. The securing features 364 may be latches, clips, fasteners or other types of securing features 364. In the illustrated embodiment, the securing features 364 are represented by deflectable latches. In an exemplar embodiment, the securing features 364 are releasable to allow the electronic module 350 to be removed from the cavity 336. The securing features 364 may pass through openings 366 in the electronic module 350. Optionally, the openings 366 are elongated to allow the electronic module to slide forward/rearward for mating/unmating the electronic module 350 to the power terminals 348.

Figure 13:
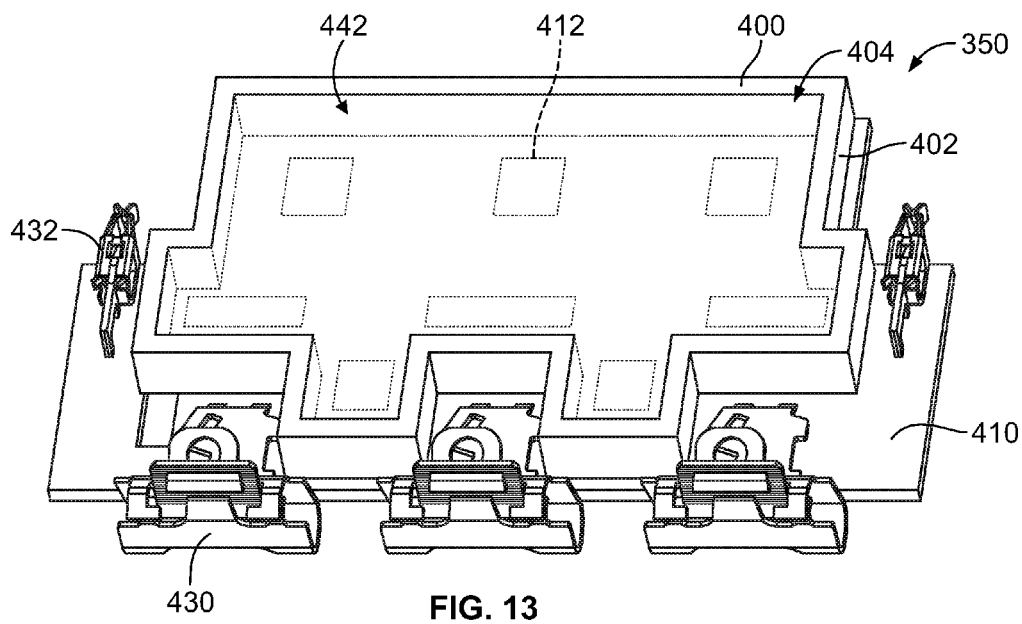
FIG. 13 is a perspective view of an electronic module in accordance with an exemplary embodiment.

FIG. 13 is a perspective view of the electronic module 350 in accordance with an exemplary embodiment. During manufacture, the electronic module 350 includes a tray 400 having tray walls 402 defining a tray cavity 404. The tray 400 is used to receive potting material forming a potting layer 442 for potting components of the electronic module 350. In an exemplary embodiment, the tray 400 is removed after the potting is set. Alternatively, the tray 400 remains after the potting is set. The tray 400 may be manufactured from a metal material or a dielectric material, such as a plastic material, and is shaped to accommodate the desired components and may be designed to minimize or reduce the amount of potting material needed.

The electronic module 350 includes a circuit board 410 including electronic components 412 (represented schematically in FIG. 13). Any type of electrical components 412 may be provided within the electronic module 350 for controlling operation of the solar junction box 302 and/or the PV system 100. The electronic components 412 may form portions of one or more circuits used for controlling operation of the solar junction box 302 and/or the PV system 100. For example, the electronic components 412 may include resistors, capacitors, diodes, transistors, conductors, integrated circuits, processors, sensors, conductive traces, and the like to define and control operation of the circuits.

The electronic module 350 includes foil contacts 430 terminated to the circuit board 410 and power contacts 432 terminated to the circuit board 410. The foil contacts 430 are configured to be electrically connected to corresponding conductive foils 116 (shown in FIG. 1) of the solar panel 106. The power contacts 432 are configured to be electrically connected to corresponding power terminals 348 (shown in FIG. 12). In the illustrated embodiment, the power contacts 432 are socket contacts configured to receive a blade or tab type power terminal 348; however other types of power contacts 432 may be used in alternative embodiments.

The potting layer 442 may be bonded to the circuit board 410 and encapsulating the electronic components 412. The potting layer 442 is formed from potting material received in the tray 400. The potting material may be cured or hardened in the tray 400 to protect the electronic components 412. Optionally, the tray 400 may be removed after the potting layer 442 is applied to the circuit board 410. In the illustrated embodiment, the contacts 430, 432 are outside of the tray 400 and the potting layer 442; however, in alternative embodiments, at least portions of the contacts 430 and/or 432 may be encapsulated in the potting layer 442.

Figure 14:
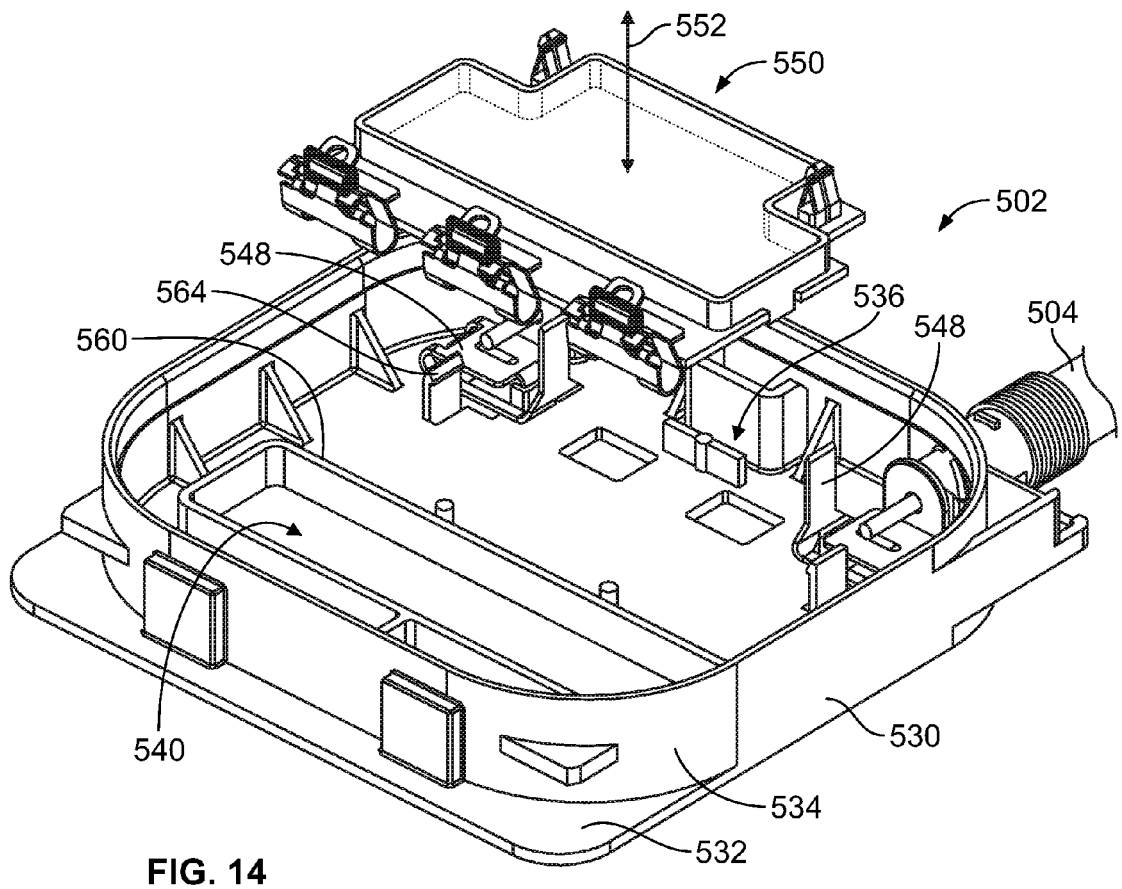
FIG. 14 is a perspective view of a solar junction box in accordance with an exemplary embodiment.

FIG. 14 is a perspective view of a solar junction box 502 in accordance with an exemplary embodiment. The solar junction box 502 is similar to the solar junction box 102 (FIG. 1) and the solar junction box 302 (FIG. 12) and may be used in the PV system 100 (FIG. 1). The solar junction box 502 includes the power cables 504, which extend into a housing 530 for termination to power terminals 548 held in the housing 530. The housing 530 includes a base 532 and a plurality of walls 534 extending from the base 532. The walls 534 define a cavity 536. In the illustrated embodiment, the power terminals 548 are located within the cavity 536. The housing 530 includes an opening 540 in the base 532 that receive the conductive foils 116. A cover (not shown) may be used to cover the cavity 536.

An electronic module 550 is configured to be removably received within the cavity 536 and electrically connected to the power terminals 548 and the conductive foils 116. The electronic module 550 is loaded into the cavity 536 of the housing 530 through the open end of the housing 530. For example, the electronic module 550 may be loaded into the housing 530 in a first direction along a loading axis 552. In the illustrated embodiment, the electronic module 550 is electrically coupled to the power terminals 548 in the loading direction. The electronic module does not need to be slid forward in a perpendicular mating direction as with the embodiments of the electronic modules 150, 350 illustrated in FIGS. 3 and 12. The electronic module 550 may be easily mated to and unmated from the power terminals 548, such as to remove and/or replace the electronic module 550 in the housing 530.

The housing 530 includes alignment features 560 used to locate the electronic module 550 in the cavity 536. The alignment features 560 may be ribs, blocks, tabs, deflectable beams, and the like used for positioning the electronic module 550 in the cavity 536. The electronic module 550 may engage the alignment features 560, such as to hold vertical and/or horizontal positions of the electronic module 550. For example, the alignment features 560 may define up-and-down, side-to-side and/or front-to-back positions of the electronic module 550.

The housing 530 includes one or more securing features 564 for securing the electronic module 550 in the cavity 536. The securing features 564 may be latches, clips, fasteners or other types of securing features 564. In the illustrated embodiment, the securing features 564 are represented by deflectable latches. In an exemplar embodiment, the securing features 564 are releasable to allow the electronic module 550 to be removed from the cavity 536.

Figure 15:
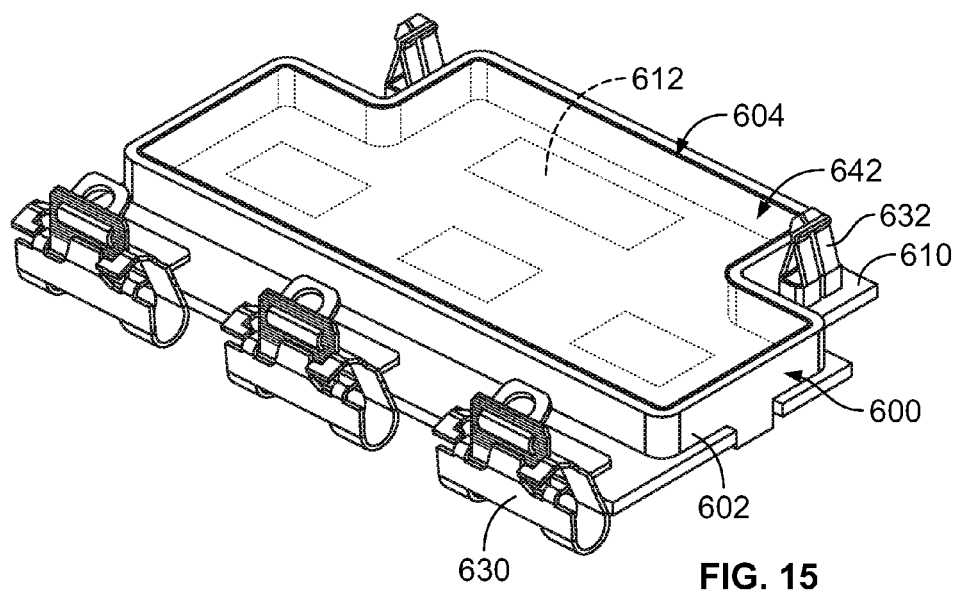
FIG. 15 is a perspective view of an electronic module in accordance with an exemplary embodiment.

FIG. 15 is a perspective view of the electronic module 550 in accordance with an exemplary embodiment. During manufacture, the electronic module 550 includes a tray 600 having tray walls 602 defining a tray cavity 604. The tray 600 is used to receive potting material forming a potting layer 642 for potting components of the electronic module 550. Optionally, the tray 600 may be removed after the potting is set. Alternatively, as in the illustrated embodiment, the tray 600 remains after the potting is set. The tray 600 may be manufactured from a metal material or a dielectric material, such as a plastic material, and is shaped to accommodate the desired components and may be designed to minimize or reduce the amount of potting material needed.

The electronic module 550 includes a circuit board 610 including electronic components 612 (represented schematically in FIG. 13). Any type of electrical components 612 may be provided within the electronic module 550 for controlling operation of the solar junction box 502 and/or the PV system 100. The electronic components 612 may form portions of one or more circuits used for controlling operation of the solar junction box 502 and/or the PV system 100. For example, the electronic components 612 may include resistors, capacitors, diodes, transistors, conductors, integrated circuits, processors, sensors, conductive traces, and the like to define and control operation of the circuits.

The electronic module 550 includes foil contacts 630 terminated to the circuit board 610 and power contacts 632 terminated to the circuit board 610. The foil contacts 630 are configured to be electrically connected to corresponding conductive foils 116 (shown in FIG. 1) of the solar panel 106. The power contacts 632 are configured to be electrically connected to corresponding power terminals 548 (shown in FIG. 12). In the illustrated embodiment, the power contacts 632 are socket contacts configured to receive a blade or tab type power terminal 548; however other types of power contacts 632 may be used in alternative embodiments.

The potting layer 642 may be bonded to the circuit board 610 and encapsulating the electronic components 612. The potting layer 642 is formed from potting material received in the tray 600. The potting material may be cured or hardened in the tray 600 to protect the electronic components 612. In the illustrated embodiment, the contacts 630, 632 are outside of the tray 600 and the potting layer 642; however, in alternative embodiments, at least portions of the contacts 630 and/or 632 may be encapsulated in the potting layer 642.

Figure 16:
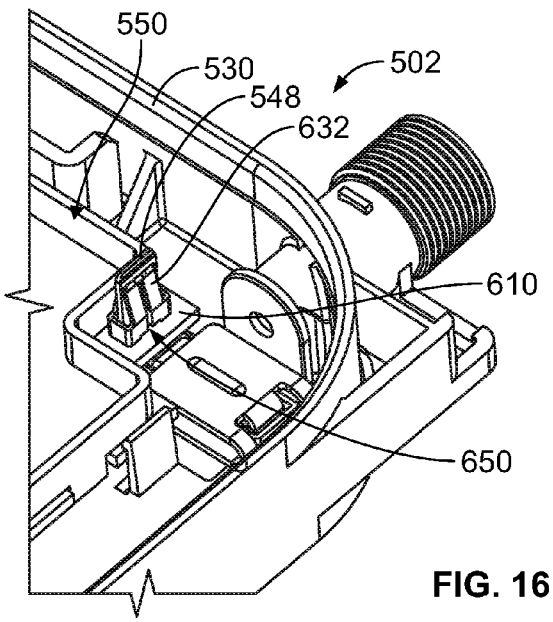
FIG. 16 is a perspective view of a portion of a solar junction box.

FIG. 16 is a perspective view of a portion of the solar junction box 502 showing the power contacts 632 electrically connected to the power terminals 548. The circuit board 610 includes an opening 650 therethrough. The power contact 632 is aligned with the opening 650 and receives the power terminal 548. In the illustrated embodiment, the power contact 632 is a socket contact and the power terminal 548 is a blade or tab terminal. The power terminal 548 passes through the circuit board 610 as the electronic module 550 is loaded into the housing 530 to electrically connect to the power contact 632. Other types of contacts and connection means may be used in alternative embodiments.

Figure 17:
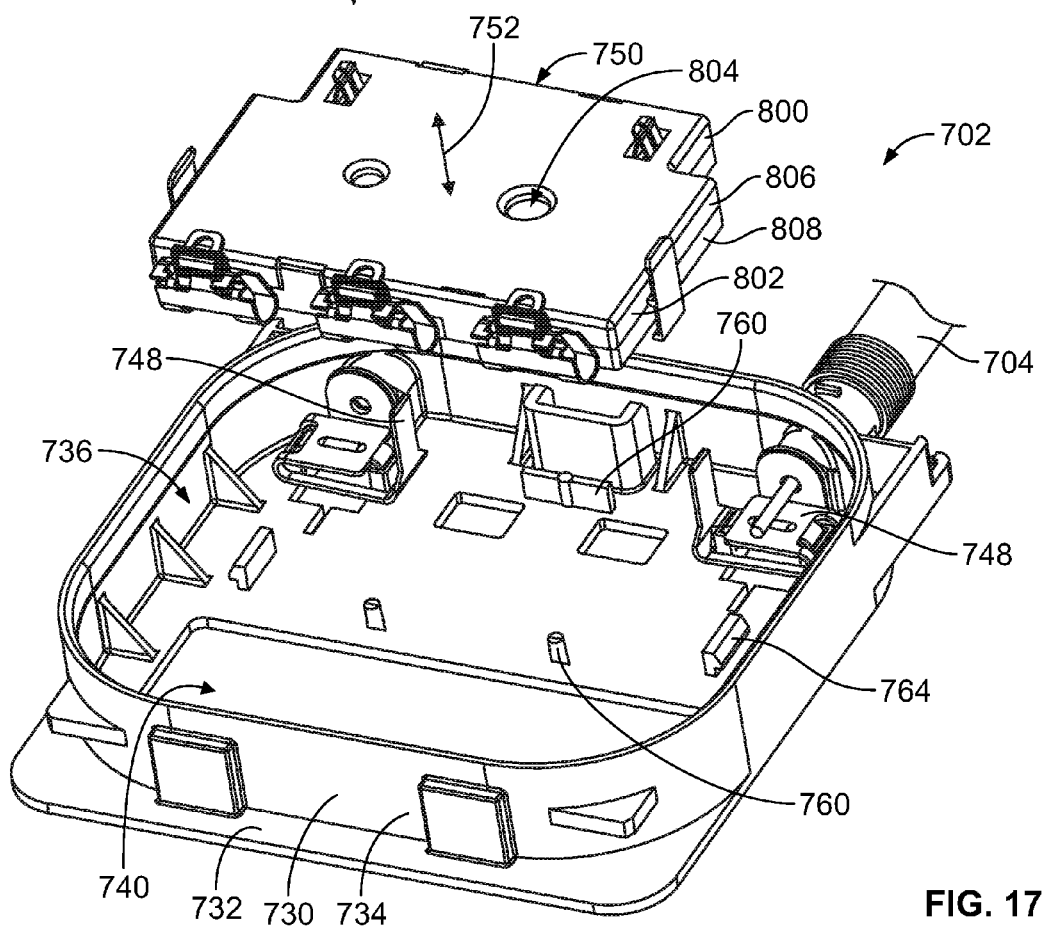
FIG. 17 is a perspective view of a solar junction box in accordance with an exemplary embodiment.

FIG. 17 is a perspective view of a solar junction box 702 in accordance with an exemplary embodiment. The solar junction box 702 is similar to the solar junction box 102 (FIG. 1), the solar junction box 302 (FIG. 12) and the solar junction box 502 (FIG. 14) and may be used in the PV system 100 (FIG. 1). The solar junction box 702 includes the power cables 704, which extend into a housing 730 for termination to power terminals 748 held in the housing 730. The housing 730 includes a base 732 and a plurality of walls 734 extending from the base 732. The walls 734 define a cavity 736. In the illustrated embodiment, the power terminals 748 are located within the cavity 736. The housing 730 includes an opening 740 in the base 732 that receive the conductive foils 116. A cover (not shown) may be used to cover the cavity 736.

An electronic module 750 is configured to be removably received within the cavity 736 and electrically connected to the power terminals 748 and the conductive foils 116. The electronic module 750 is loaded into the cavity 736 of the housing 730 through the open end of the housing 730. For example, the electronic module 750 may be loaded into the housing 730 in a first direction along a loading axis 752. In the illustrated embodiment, the electronic module 750 is electrically coupled to the power terminals 748 in the loading direction. The electronic module does not need to be slid forward in a perpendicular mating direction as with the embodiments of the electronic modules 150, 350 illustrated in FIGS. 3 and 12. The electronic module 750 may be easily mated to and unmated from the power terminals 748, such as to remove and/or replace the electronic module 750 in the housing 730.

The housing 730 includes alignment features 760 used to locate the electronic module 750 in the cavity 736. The alignment features 760 may be ribs, blocks, tabs, deflectable beams, and the like used for positioning the electronic module 750 in the cavity 736. The electronic module 750 may engage the alignment features 760, such as to hold vertical and/or horizontal positions of the electronic module 750. For example, the alignment features 760 may define up-and-down, side-to-side and/or front-to-back positions of the electronic module 750.

The housing 730 includes one or more securing features 764 for securing the electronic module 750 in the cavity 736. The securing features 764 may be latches, clips, fasteners or other types of securing features 764. In the illustrated embodiment, the securing features 764 are represented by stationary latches configured to interact with deflectable latches of the electronic module 750.

The electronic module 750 includes a tray 800 having tray walls 802 defining a tray cavity 804. The tray 800 is used to receive potting material forming a potting layer for potting components of the electronic module 750. For example, holes may be provided in the top and/or the bottom to receive potting material. The holes may also be used for venting. Optionally, the tray 800 may be manufactured from multiple pieces, such as an upper shell 806 and a lower shell 808 defining the cavity 804 therebetween.

Figure 18:
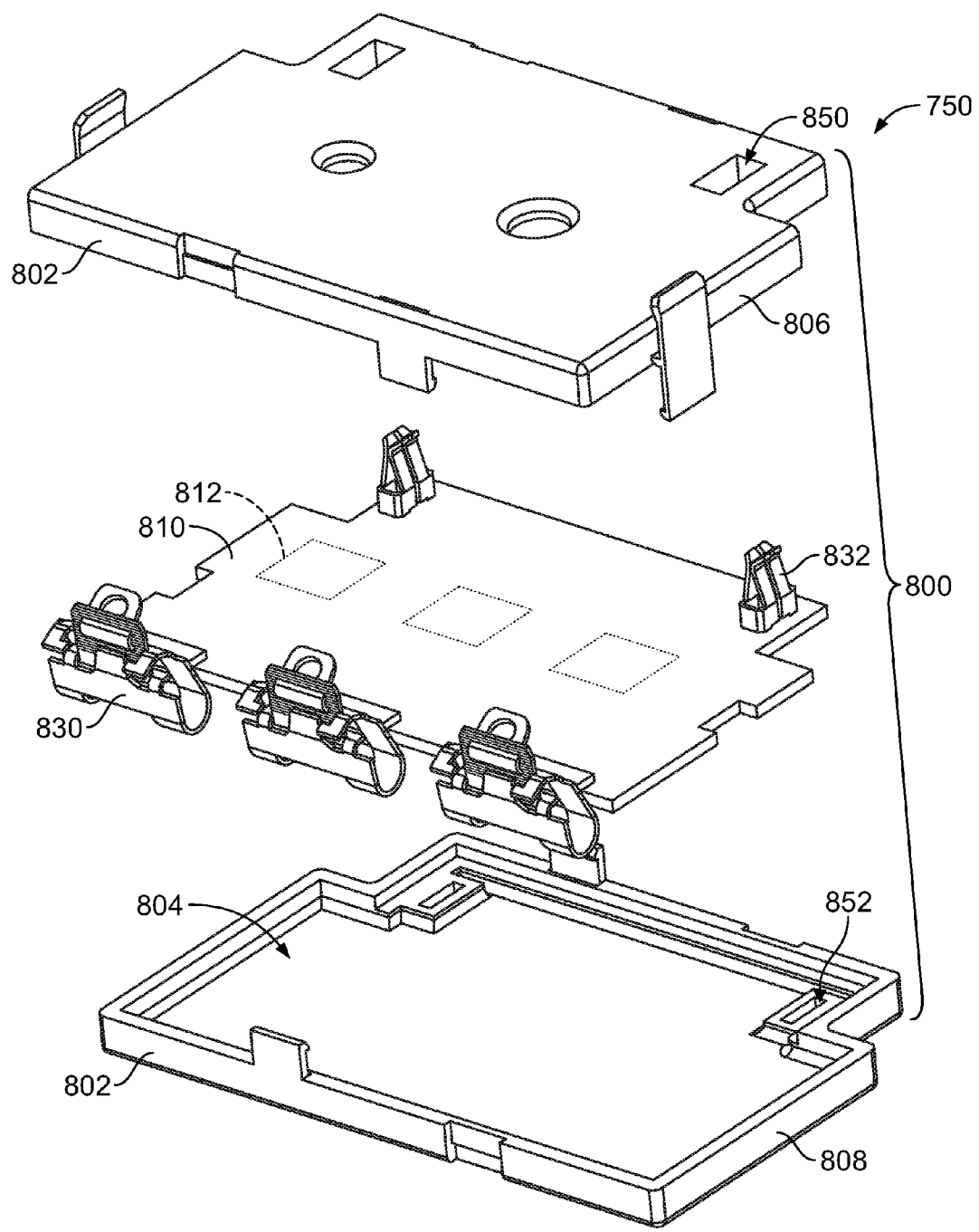
FIG. 18 is an exploded view of an electronic module in accordance with an exemplary embodiment.

FIG. 18 is an exploded view of the electronic module 750. The electronic module 750 includes a circuit board 810 including electronic components 812 (represented schematically in FIG. 19). Any type of electrical components 812 may be provided within the electronic module 750 for controlling operation of the solar junction box 702 and/or the PV system 100. The electronic components 812 may form portions of one or more circuits used for controlling operation of the solar junction box 702 and/or the PV system 100. For example, the electronic components 812 may include resistors, capacitors, diodes, transistors, conductors, integrated circuits, processors, sensors, conductive traces, and the like to define and control operation of the circuits.

The electronic module 750 includes foil contacts 830 terminated to the circuit board 810 and power contacts 832 terminated to the circuit board 810. The foil contacts 830 are configured to be electrically connected to corresponding conductive foils 116 (shown in FIG. 1) of the solar panel 106. The power contacts 832 are configured to be electrically connected to corresponding power terminals 748 (shown in FIG. 12). In the illustrated embodiment, the power contacts 832 are socket contacts configured to receive a blade or tab type power terminal 748; however other types of power contacts 832 may be used in alternative embodiments.

The upper and lower shells 806, 808 may be coupled together around the circuit board 810. The upper and lower shells 806, 808 may then be filled with potting material to form the potting layer around the circuit board 810 to encapsulating the electronic components 812. Optionally, portions of the contacts 830, 832 may be received inside the tray 800 and portions of the contacts 830, 832 may extend outside of the tray 800. In the illustrated embodiment, the upper and lower shells 806, 808 include openings 850, 852 configured to receive the power terminals 748. The power contacts 832 may extend through the openings 850 in the upper shell 806.

Figure 19:
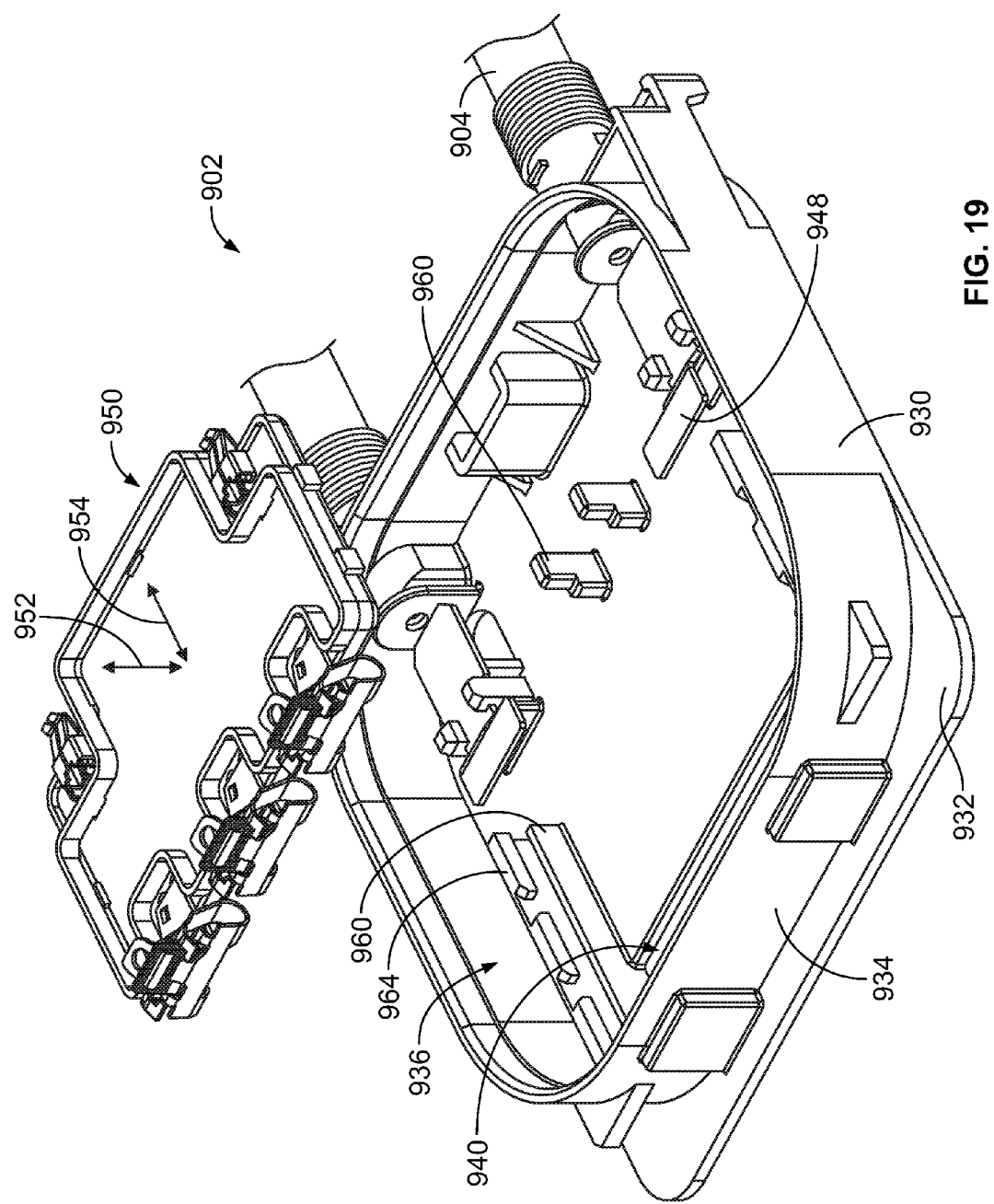
FIG. 19 is a perspective view of a solar junction box in accordance with an exemplary embodiment.

FIG. 19 is a perspective view of a solar junction box 902 in accordance with an exemplary embodiment. The solar junction box 902 is similar to the solar junction box 102 (FIG. 1), the solar junction box 302 (FIG. 12), the solar junction box 502 (FIG. 14) and the solar junction box 702 (FIG. 17) and may be used in the PV system 100 (FIG. 1). The solar junction box 902 includes the power cables 904, which extend into a housing 930 for termination to power terminals 948 held in the housing 930. The housing 930 includes a base 932 and a plurality of walls 934 extending from the base 932. The walls 934 define a cavity 936. In the illustrated embodiment, the power terminals 948 are located within the cavity 936. The housing 930 includes an opening 940 in the base 932 that receive the conductive foils 116. A cover (not shown) may be used to cover the cavity 936.

An electronic module 950 is configured to be removably received within the cavity 936 and electrically connected to the power terminals 948 and the conductive foils 116. The electronic module 950 is loaded into the cavity 936 of the housing 930 through the open end of the housing 930. For example, the electronic module 950 may be loaded into the housing 930 in a first direction along a loading axis 952 and in a second direction along a mating axis 954. The electronic module 950 may be easily mated to and unmated from the power terminals 948, such as to remove and/or replace the electronic module 950 in the housing 930.

The housing 930 includes alignment features 960 used to locate the electronic module 950 in the cavity 936. The alignment features 960 may be ribs, blocks, tabs, deflectable beams, and the like used for positioning the electronic module 950 in the cavity 936. The electronic module 950 may engage the alignment features 960, such as to hold vertical and/or horizontal positions of the electronic module 950. For example, the alignment features 960 may define up-and-down, side-to-side and/or front-to-back positions of the electronic module 950.

The housing 930 includes one or more securing features 964 for securing the electronic module 950 in the cavity 936. The securing features 964 may be latches, clips, fasteners or other types of securing features 964. In the illustrated embodiment, the securing features 964 are represented by deflectable latches configured to interact with the electronic module 950.

Figure 20:
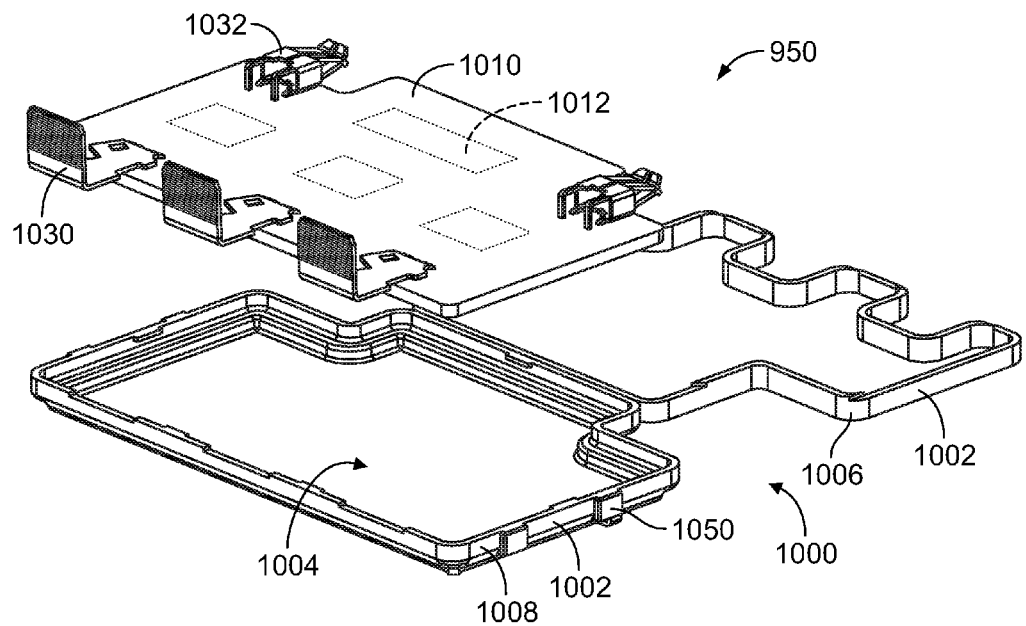
FIG. 20 is an exploded view of an electronic module in accordance with an exemplary embodiment.
Figure 21:
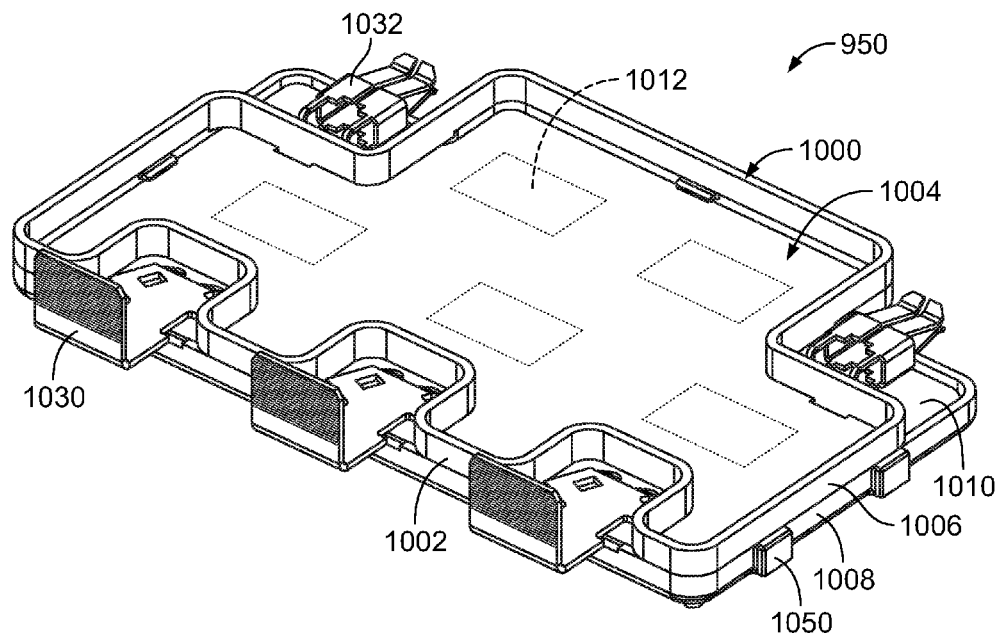
FIG. 21 is a perspective view of an electronic module in accordance with an exemplary embodiment.

FIG. 20 is an exploded view of the electronic module 950 in accordance with an exemplary embodiment. FIG. 21 is a perspective view of the electronic module 950. The electronic module 950 includes a tray 1000 having tray walls 1002 defining a tray cavity 1004. The tray 1000 is used to receive potting material forming a potting layer for potting components of the electronic module 950. Optionally, the tray 1000 may be manufactured from multiple pieces, such as an upper shell 1006 and a lower shell 1008 defining the cavity 1004 therebetween. The upper shell 1006 may be hingedly coupled to the lower shell 1008. The upper shell 1006 may be open while the lower shell 1008 may be closed.

The electronic module 950 includes a circuit board 1010 including electronic components 1012 (represented schematically in FIGS. 20 and 21). Any type of electrical components 1012 may be provided within the electronic module 950 for controlling operation of the solar junction box 902 and/or the PV system 100. The electronic components 1012 may form portions of one or more circuits used for controlling operation of the solar junction box 902 and/or the PV system 100. For example, the electronic components 1012 may include resistors, capacitors, diodes, transistors, conductors, integrated circuits, processors, sensors, conductive traces, and the like to define and control operation of the circuits.

The electronic module 950 includes foil contacts 1030 terminated to the circuit board 1010 and power contacts 1032 terminated to the circuit board 1010. The foil contacts 1030 are configured to be electrically connected to corresponding conductive foils 116 (shown in FIG. 1) of the solar panel 106. The power contacts 1032 are configured to be electrically connected to corresponding power terminals 948 (shown in FIG. 12). In the illustrated embodiment, the power contacts 1032 are socket contacts configured to receive a blade or tab type power terminal 948; however other types of power contacts 1032 may be used in alternative embodiments.

The upper and lower shells 1006, 1008 may be coupled together around the circuit board 1010. The upper and lower shells 1006, 1008 may then be filled with potting material to form the potting layer around the circuit board 1010 to encapsulating the electronic components 1012. Optionally, the contacts 1030, 1032 may be located outside of the tray 1000. In an exemplary embodiment, the tray 1000 may include alignment features 1050 for locating the tray 1000 in the housing 930. In the illustrated embodiment, the alignment features 1050 are tabs extending outward from both sides of the lower shell 1008; however, other types of alignment features 1050 may be used in alternative embodiments.

Figure 22:
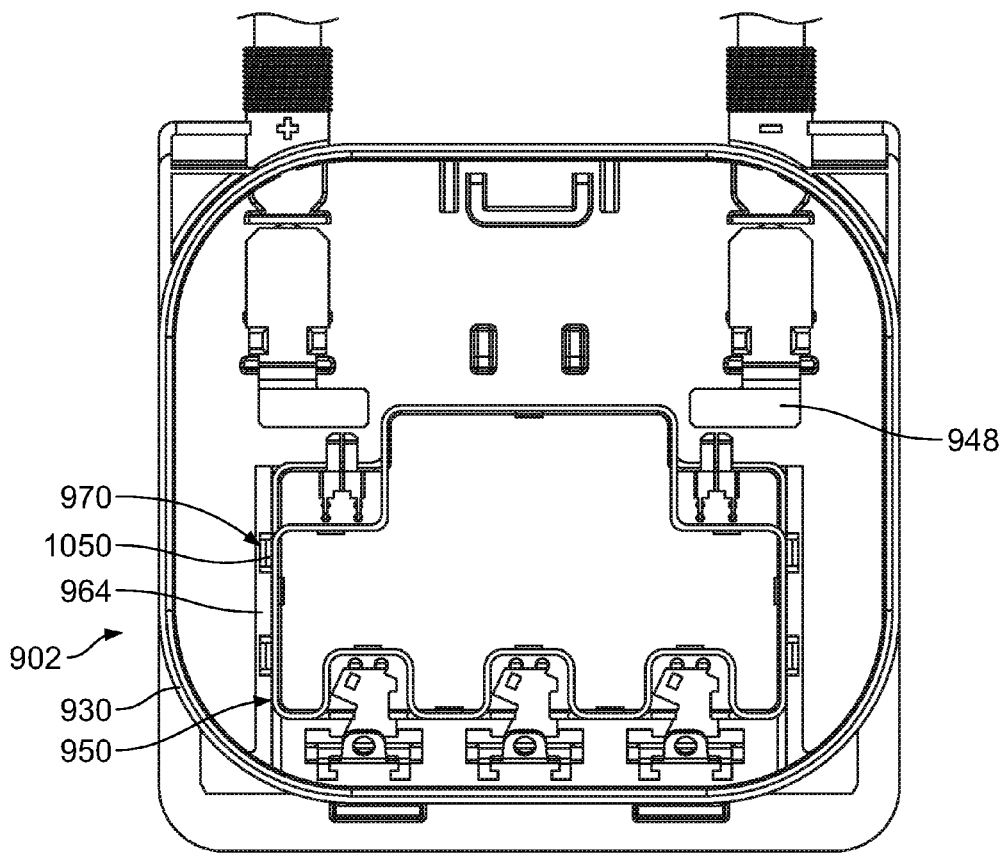
FIG. 22 is a top view of an electronic module loaded into a housing and positioned in an unmated position.
Figure 23:
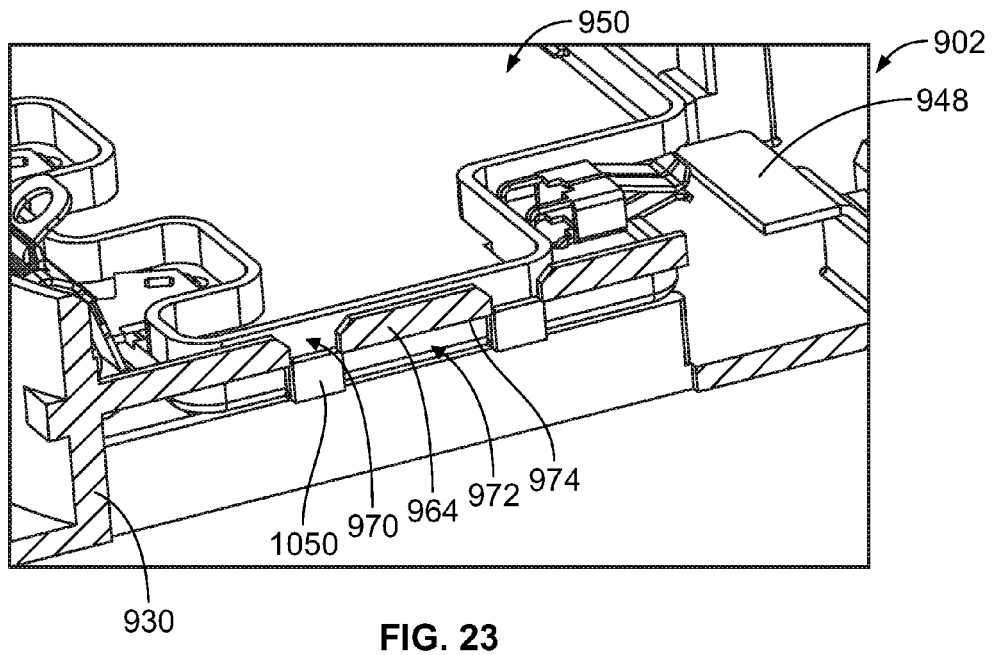
FIG. 23 is a partial sectional view of a portion of a solar junction box showing an electronic module loaded into a housing and positioned in an unmated position.
Figure 24:
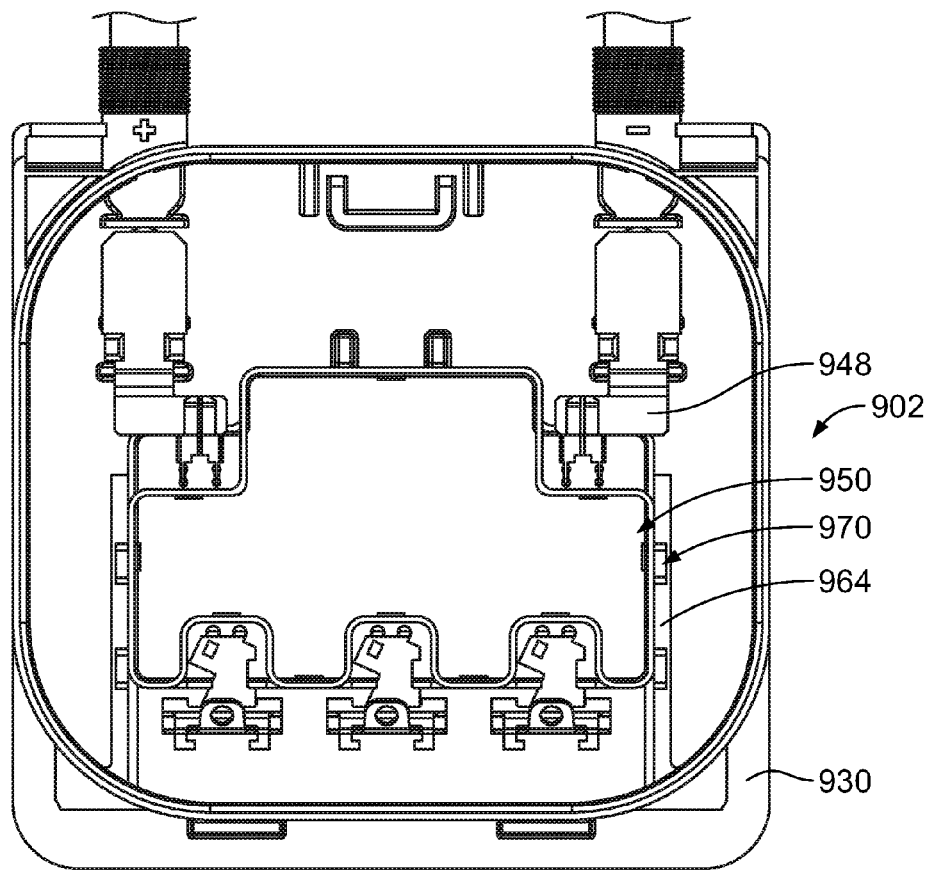
FIG. 24 is a top view of an electronic module loaded into a housing and positioned in a mated position.
Figure 25:
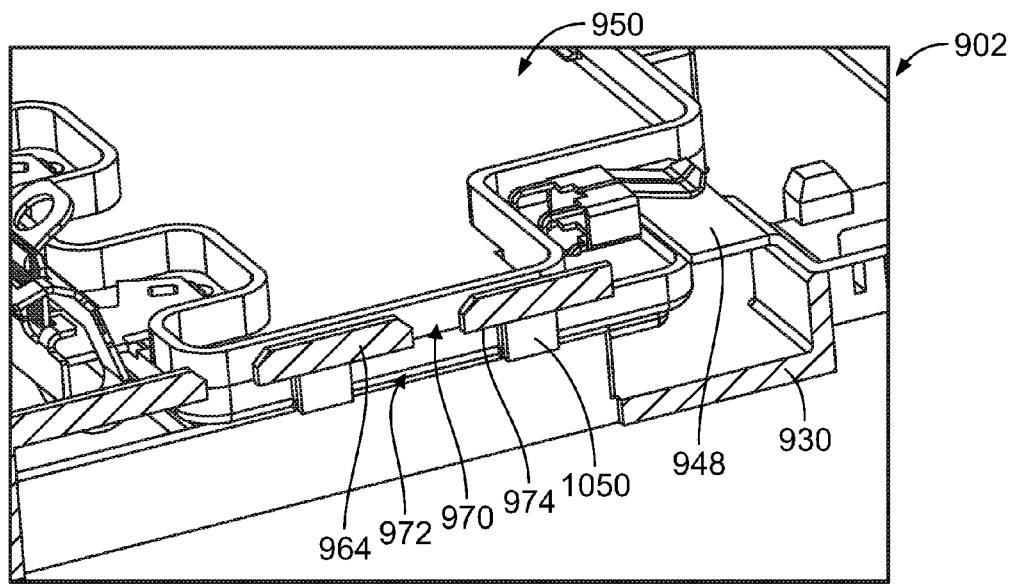
FIG. 25 is a partial sectional view of a portion of a solar junction box showing an electronic module loaded into a housing and positioned in a mated position.

FIG. 22 is a top view of the electronic module 950 loaded into the housing 930 and positioned in an unmated position. FIG. 23 is a partial sectional view of a portion of the solar junction box 902 showing the electronic module 950 loaded into the housing 930 and positioned in the unmated position. FIG. 24 is a top view of the electronic module 950 loaded into the housing 930 and positioned in a mated position. FIG. 25 is a partial sectional view of a portion of the solar junction box 902 showing the electronic module 950 loaded into the housing 930 and positioned in the mated position. In the mated position, the power contacts 1032 are electrically connected to the power terminals 948. In the mated position, the alignment features 1050 engage the securing features 964 to secure the electronic module 950 in the mated position.

The securing features 964 include slots 970 in a rail 972 that are sized, shaped and positioned to receive the alignment features 1050. For example, the electronic module 950 may be loaded in the loading direction until the alignment features 1050 pass through the slots 970. The electronic module 950 may then be slid forward in the mating direction to the mated position. As the electronic module 950 is slid forward, the alignment features 1050 are captured below a ledge 974 of the rail 972 to capture the electronic module 950 in the housing 930. The electronic module 950 may be removed by sliding the electronic module 950 rearward until the alignment features 1050 are aligned with the slots 970.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A solar junction box for a solar panel having at least one photovoltaic cell and a conductive foil electrically connected to the at least one cell, the solar junction box comprising:
a housing having a base and walls defining a cavity, the base having an opening configured to receive the conductive foil;
a power cable held in the housing, the power cable having a power terminal terminated to an end of the power cable, the power terminal being positioned within the housing; and
an electronic module removably received in the cavity, the electronic module having a circuit board including electronic components mounted to the circuit board, the electronic module having a foil contact configured to be removably coupled to the foil, the electronic module having a power contact configured to be removably coupled to the power terminal, the circuit board having a power circuit electrically connecting the foil contact and the power contact.

2. The solar junction box of claim 1, wherein the power contact is configured to be mated to and unmated from the power terminal in a mating direction.

3. The solar junction box of claim 1, wherein the power contact includes one of a tab or a socket for mating with the power terminal being the other of a tab or a socket.

4. The solar junction box of claim 1, wherein the electronic module includes a potting layer on the circuit board encapsulating the electronic components.

5. The solar junction box of claim 4, wherein the electronic module includes a tray receiving potting material to form the potting layer.

6. The solar junction box of claim 1, wherein the electronic module is loaded into the housing in a first direction generally parallel to the walls of the housing.

7. The solar junction box of claim 6, wherein the electronic module is mated to the power terminals by sliding the electronic module within the cavity in a second direction perpendicular to the first direction and generally parallel to the base.

8. The solar junction box of claim 1, wherein the electronic module includes a tray having tray walls defining a tray cavity, the circuit board being received in the tray cavity, the tray cavity being filled with potting material to encapsulate the circuit board and the electronic components, the foil contact and the power contact extending from the tray to be removably coupled to the foil and the power terminal, respectively.

9. The solar junction box of claim 1, wherein the housing includes alignment features, the electronic module engaging the alignment features to locate the electronic module in the cavity.

10. The solar junction box of claim 1, wherein the housing includes deflectable locating features engaging the electronic module and biasing the electronic module away from the base.

11. The solar junction box of claim 1, wherein the housing includes a securing feature for securing the electronic module in the cavity, the electronic module being configured to be released from the securing features to remove the electronic module from the cavity.

12. The solar junction box of claim 1, wherein the electronic module includes guide rails engaging the housing to locate the electronic module in the cavity.

13. The solar junction box of claim 12, wherein the guide rails fix the position of the electronic module in the cavity in at least two perpendicular directions.

14. The solar junction box of claim 1, wherein the circuit board includes a power circuit electrically connecting the foil contact and the power contact and a monitoring circuit monitoring power through the power circuit and generating an output, the electronic module having a communication circuit communicating the output from the monitoring circuit outside of the solar junction box.

15. The solar junction box of claim 1, wherein the circuit board includes a power circuit electrically connecting the foil contact and the power contact and a shut-down circuit operably coupled to the power circuit, the shut-down circuit being configured to shut down the power circuit.

16. The solar junction box of claim 1, wherein the circuit board includes a power circuit electrically connecting the foil contact and the power contact and a bypass circuit operably coupled to the power circuit, the bypass circuit being configured to bypass current flow in the power circuit between the foil contact and the power contact.

17. A solar junction box for a solar panel having at least one photovoltaic cell and a conductive foil electrically connected to the at least one cell, the solar junction box comprising:
 a housing having a base and walls defining a cavity, the base having an opening configured to receive the conductive foil;
 a power cable held in the housing, the power cable having a power terminal terminated to an end of the power cable, the power terminal being positioned within the housing; and
 an electronic module removably received in the cavity, the electronic module having a circuit board including electronic components mounted to the circuit board, the electronic module having a potting layer bonded to the circuit board and encapsulating the electronic components, the electronic module having a foil contact configured to be removably coupled to the foil, the electronic module having a power contact configured to be removably coupled to the power terminal, the circuit board having a power circuit electrically connecting the foil contact and the power contact.

18. The solar junction box of claim 17, wherein the electronic module includes a tray having tray walls defining a tray cavity, the circuit board being received in the tray cavity, the tray cavity being filled with potting material to define the potting layer.

19. The solar junction box of claim 17, wherein the housing includes a securing feature for securing the electronic module in the cavity, the electronic module being configured to be released from the securing features to remove the electronic module from the cavity.

20. A solar junction box for a solar panel having at least one photovoltaic cell and a conductive foil electrically connected to the at least one cell, the solar junction box comprising:
 a housing having a base and walls defining a cavity, the base having a opening configured to receive the conductive foil;
 a power cable held in the housing, the power cable having a power terminal terminated to an end of the power cable, the power terminal being positioned within the housing; and
 an electronic module removably received in the cavity, the electronic module having a circuit board, the electronic module having a foil contact mounted to the circuit board and configured to be removably coupled to the foil, the electronic module having a power contact mounted to the circuit board and configured to be removably coupled to the power terminal, the circuit board having a power circuit electrically connecting the foil contact and the power contact, the electronic module having a monitoring circuit monitoring power through the power circuit and generating an output, the electronic module having a communication circuit communicating the output from the monitoring circuit outside of the solar junction box.

\* \* \* \* \*